United States Patent [19]
Hawkes

[11] Patent Number: 5,016,019
[45] Date of Patent: May 14, 1991

[54] METHOD AND APPARATUS FOR PROCESSING SYNTHETIC APERTURE AERIAL SIGNALS

[75] Inventor: Henry W. Hawkes, Wynchcombe, England

[73] Assignee: The Secretary of State for Defence in Her Britannic Majesty's Government of the United Kingdom of Great Britain and Northern Ireland, London, United Kingdom

[21] Appl. No.: 457,704

[22] PCT Filed: May 24, 1988

[86] PCT No.: PCT/GB88/00407
§ 371 Date: Jan. 4, 1990
§ 102(e) Date: Jan. 4, 1990

[87] PCT Pub. No.: WO88/09938
PCT Pub. Date: Dec. 15, 1988

[30] Foreign Application Priority Data
Jun. 5, 1987 [GB] United Kingdom ............... 8713212
Aug. 21, 1987 [GB] United Kingdom ............... 8719853

[51] Int. Cl.$^5$ .................................................. G01S 1/44
[52] U.S. Cl. .................................................. 342/400
[58] Field of Search ........................ 342/400, 401, 404

[56] References Cited
U.S. PATENT DOCUMENTS
3,886,555  5/1975  Royal ................................. 342/425
4,078,234  3/1978  Fishbein et al. ................... 342/110
4,176,351  11/1979  Devita et al. ..................... 342/128
4,617,567  10/1986  Chan ................................. 342/196

*Primary Examiner*—Theodore M. Blum
*Attorney, Agent, or Firm*—Nixon & Vanderhye

[57] ABSTRACT

A method and apparatus of deriving a directional polar diagram from the signals R received by a synthetic-aperture aerial (in direction-finding applications), or P from such an aerial (in radio-beacon applications), these signals including a carrier of frequency $\omega$ which is phase-modulated at the scanning frequency $\omega_m$ of the individual aerials. The method comprises generating an "estimated" signal (26) of frequency $\omega$ phase-modulated at frequency $\omega_m$, and multiplying (25) the generated signal by the received signal to derive an output which includes a selectable Bessel Function ($J_O$) representing the directional polar diagram. The phase (with circular aerial arrays) (27) or amplitude (with linear aerial arrays) of $\omega_m$ as applied to phase-modulate the generated signal is controlled to maximize or minimize, as appropriate, the selected Bessel Function and thereby control the bearing direction of the polar diagram. The zero-order Function $J_O$ gives a lobe maximum in the bearing direction, the higher orders, $J_1$, $J_2$, etc. a lobe null. The phase difference between $\omega$ in the generated and received signals is averaged-out by shifting the frequency of the former by a increment $\omega_x$.

40 Claims, 12 Drawing Sheets

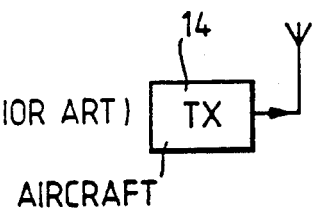
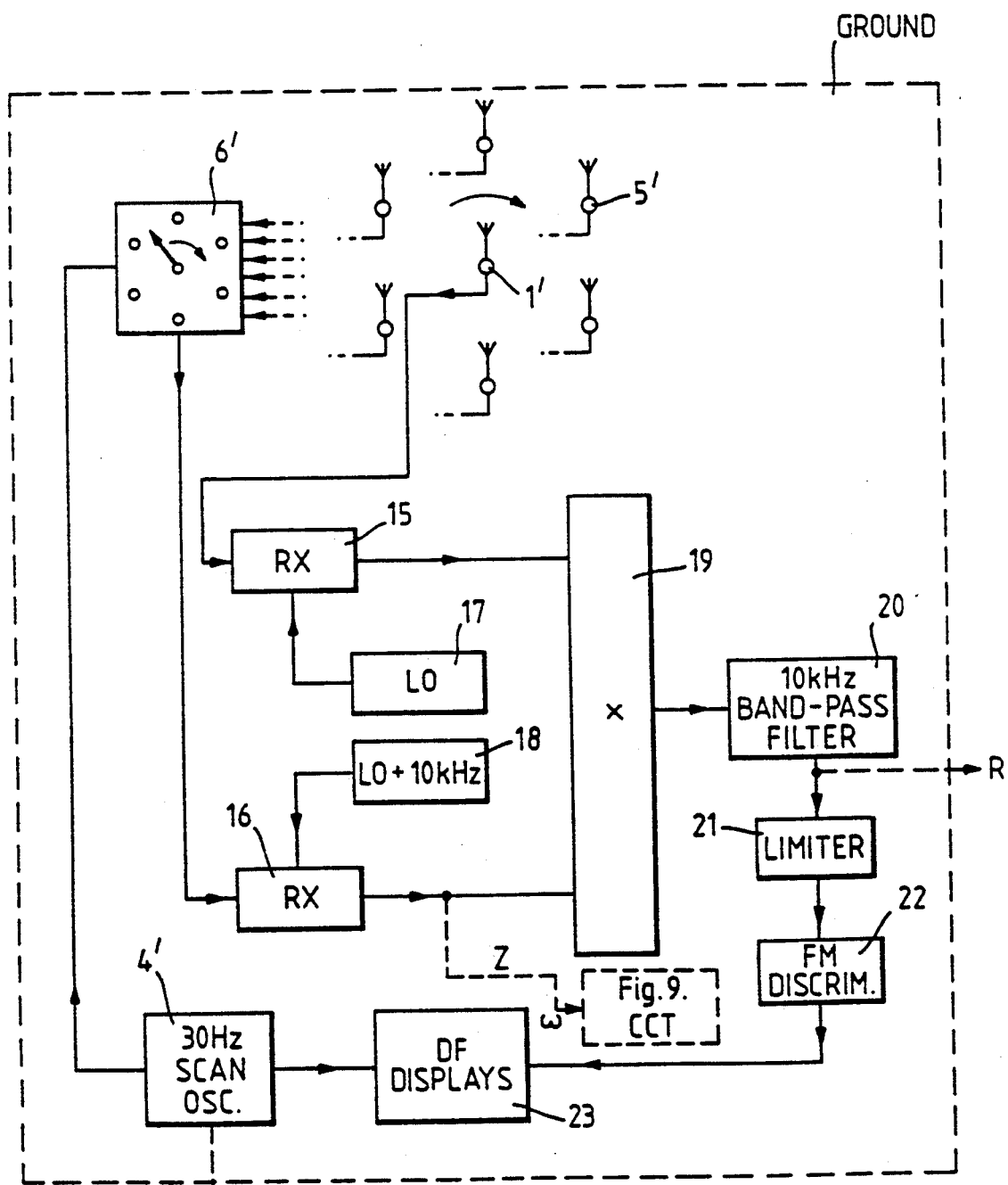

METHOD AND APPARATUS FOR PROCESSING SYNTHETIC APERTURE AERIAL SIGNALS

This is a National Phase application based upon PCT application No. PCT/GB88/00407 filed May 24, 1988.

This invention relates to processing synthetic-aperture aerial signals and in particular to methods and apparatus for generating directional polar diagrams with such aerials. The invention has particular application to radio direction-finding (DF) systems for determining the azimuth bearing of radio emissions, e.g., from aircraft, and, reciprocally, to radio beacons for enabling e.g., an aircraft to determine its azimuth bearing from a fixed ground transmitter. However, the invention is also applicable in other instances where a directional polar diagram is required, e.g., in aircraft short-range approach and/or landing aids.

The performance of DF and beacon systems depends on generating polar diagrams of sufficient directivity to discriminate against reflections from directions outside the direct line between the ground-station and e.g., the aircraft; such reflections can introduce what are termed "site errors" (even when remote from the ground-station) in the determined bearing. Present systems using synthetic-aperture aerials, such as VOR (VHF Omni-Range) beacons, give good site-error performance provided the wanted (direct) signal is greater than the unwanted reflections and provided the wanted signal exceeds a given amplitude level. If these two criteria are not met, the performance suffers a drastic decline, and this is also true of DF systems using such aerials. For this reason the term "synthetic-aperture" is not strictly appropriate in relation to such systems, as will be explained hereafter.

This decline in performance results from the inclusion of an amplitude-limiter in the signal-processing circuits of these systems. The present invention provides a method of processing the signals received by the aircraft (in the beacon case) or from the aircraft (in the DF case) which allows elimination of the amplitude-limiter and thereby alleviates the site-error problem at low signal amplitudes and/or when the unwanted signal exceeds the wanted signal, caused by its inclusion. Other advantages of its elimination will become apparent from the description.

According to the present invention a method of processing signals received by a synthetic aperture aerial (as hereinafter defined) from an external radiator, or received from said aerial at an external position, said signals including a carrier frequency which is phase-modulated at the scanning frequency of said aerial, comprises:

generating a signal of the same carrier frequency as the received signal and phase-modulated at the scanning frequency;

multiplying the generated signal by the received signal to derive an output which includes a selectable Bessel Function representing a directional polar diagram;

and controlling the phase or amplitude (depending on the aerial configuration) of the scanning frequency, as applied to produce said phase-modulation of the generated signal, in order to maximise or minimise, as appropriate, a selected Bessel Function and thereby control the bearing direction of said polar diagram relative to the aerial.

The generated carrier may be shifted by an increment in order to average-out phase differences between the received and generated carriers.

The component of the multiplied output unmodulated by the scanning frequency may be selected, constituting a zero-order Bessel Function whose maximum value represents a polar diagram having its main lobe in the bearing direction. Alternatively or additionally the component of the multiplied output modulated by the scanning frequency or a harmonic thereof may be selected, constituting a first-order or higher-order Bessel Function whose minimum value represents a polar diagram having a null in the bearing direction.

The method may comprise adding two fixed scanning-frequency phase-shifts or amplitude-shifts to said controlling phase of the scanning-frequency in opposite senses, the two summed phases being applied to phase-modulate or amplitude-modulate the carriers of two generated signals which are separately multiplied by the received signal to derive outputs constituting two zero-order Bessel Functions whose maximum values represent a polar diagram having two overlapping main lobes which are symmetrical about the bearing direction.

The selected first-order or higher-order component may be multiplied by a 90° phase-shifted version of the controlling phase of the scanning frequency or a harmonic thereof in order to derive an output having reduced noise.

The first-order Bessel Function amplitude-modulating said averaging-out increment may be detected in effectively a synchronous manner with respect to a 90° phase-shifted version of a zero-order Bessel Function amplitude-modulating said averaging-out increment, to provide an output whose polarity defines on which side of the null the instantaneous direction of the received signal lies. The zero-order Bessel Function amplitude-modulating said averaging-out increment may be normalised prior to said detection in order to obtain a relatively constant amplitude.

The present invention includes a method of processing the signal transmitted from the synthetic-aperture aerial of a radio-beacon and received by an aircraft, comprising a method of processing as aforesaid wherein the operator in the aircraft adjusts the phase or amplitude of the scanning frequency as applied to produce said phase-modulation of the generated signal in order to determine the bearing to the beacon as the phase, relative to a reference phase, required to obtain a Bessel Function output or outputs representing the bearing to the beacon. This method may be used additionally to a method in which the signal from the synthetic-aperture aerial is processed by means including an amplitude-limiter and, optionally, a frequency-discriminator. The aerial may comprise a circular array of scanned omni-directional elements and a single continuously transmitting omni-directional reference element, the phase of the scanning frequency being controlled. Alternatively the serial may comprise a linear array of sinusoidally scanned omni-directional elements and a single continuously transmitting reference element, the amplitude of the scanning frequency being controlled.

The present invention also includes a method of determining the bearing of a signal or signals received by a synthetic aperture aerial from a radiator or radiators, comprising a method of processing as aforesaid wherein the phase or amplitude of the scanning frequency as applied to produce said phase-modulation of the generated signal is continuously varied at a low frequency to scan the polar diagram over an arc of interest and the bearing of the received signal or signals is indicated by their temporal position relative to the phase or amplitude of said low-frequency scan.

The generated signal may be produced by feeding the carrier-frequency signal received from the synthetic-aperture aerial to a first multiplier connected in a phase-lock loop including a first low-pass filter and a voltage-controlled oscillator, said oscillator also receiving as a control voltage the scanning frequency at the controlled phase or amplitude, whereby the oscillator output constitutes the generated signal. The output of said first multiplier may be fed via a second low-pass filter to a second multiplier which also receives said averaging-out increment, the output of said second multiplier being fed via said first low-pass filter as a control voltage to said oscillator. The output of said first multiplier may be divided into two channels, one of which selects and squares its zero-order Bessel Function output and the other selects and squares its first-order Bessel Function output, the first-order output being 90° phase-shifted and added to the zero-order output and their sum fed to a second multiplier which also receives twice said averaging-out increment, and the output of said second multiplier being fed via said first low-pass filter as a control voltage to said oscillator. Instead of the first multiplier receiving its input from the aerial, it may be received from a stable unmodulated local oscillator of substantially the carrier frequency.

Alternatively said generated signal may be produced by feeding a signal received by or from a single omnidirectional reference aerial element to a single-sideband generator having as a second input said increment for averaging-out phase-differences, said generator being such as to produce an output which is either the sum or difference only of said two input signals, said second input deriving from oscillator means which receives as a control signal the scanning frequency at the controlled phase or amplitude, whereby the single-sideband generator output constitutes said generated signal.

Said oscillator means may comprise a single oscillator, or may comprise two oscillators differing in frequency by said averaging-out increment, one of said oscillators receiving said control signal and their two outputs being combined to produce said second input to said generator.

The present invention also includes a method of processing as aforesaid wherein said generated signal is multiplied directly by said received signal and is also multiplied separately by said received signal after a 90° phase change of said generated signal, the two products being separately squared, their squares added, and the square-root of their sum derived as the Bessel Function representing the directional polar diagram.

The present invention also provides apparatus for use in methods as aforesaid.

The invention will now be described by way of example with reference to the accompanying drawings wherein:

FIGS. 2A and 2B are circuit diagrams of a known form of DF system,

Figure 1:
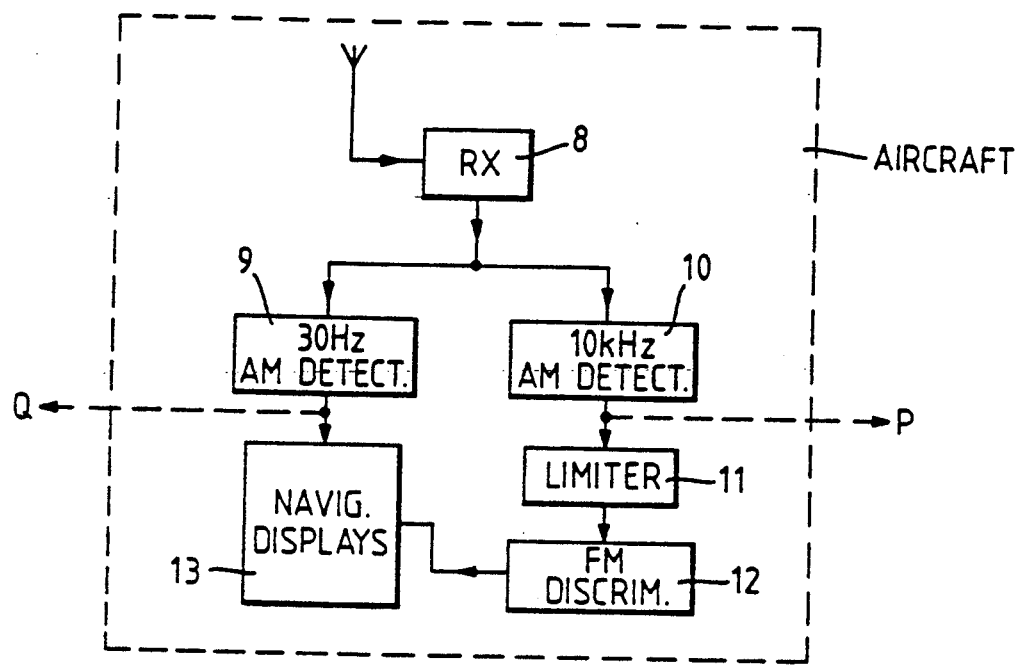
FIGS. 1A and 1B are circuit diagrams of a known form of radio beacon.
Figure 1:
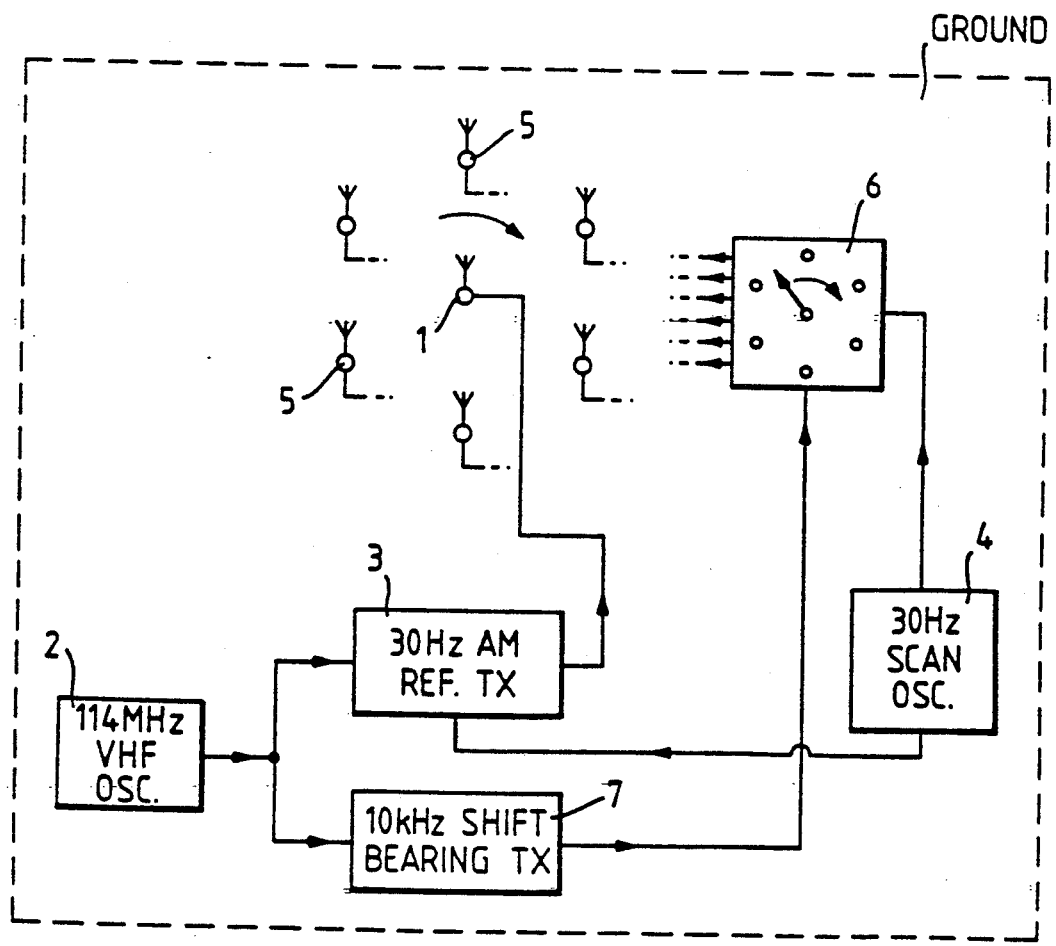
Figure 3:
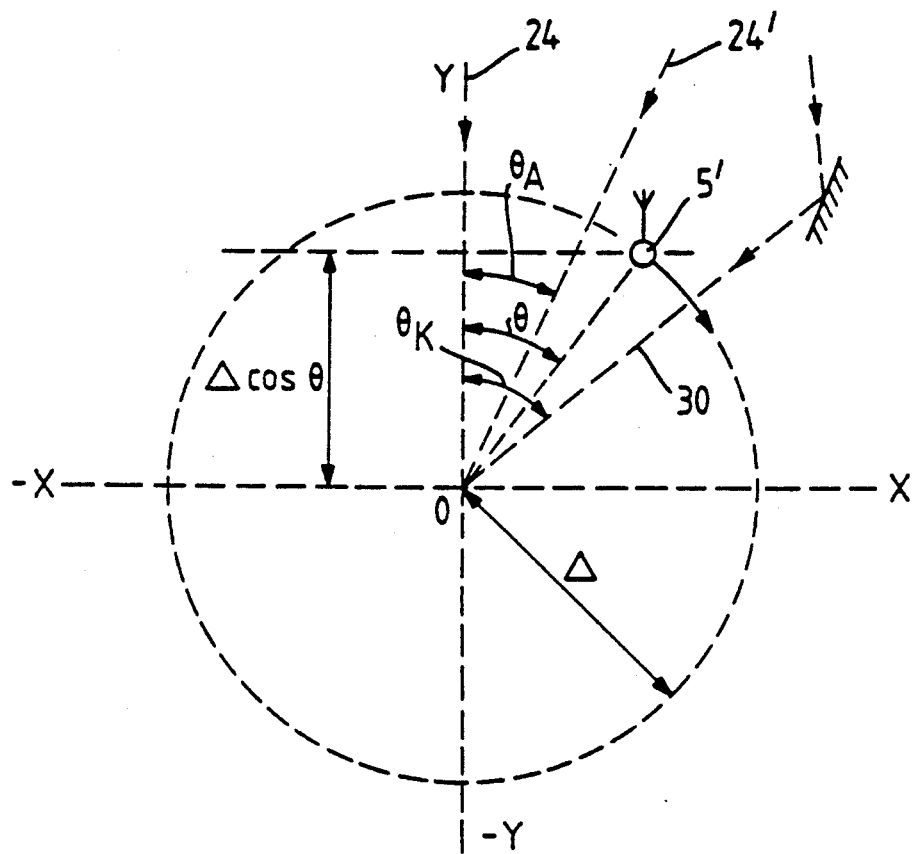
Figure 4:
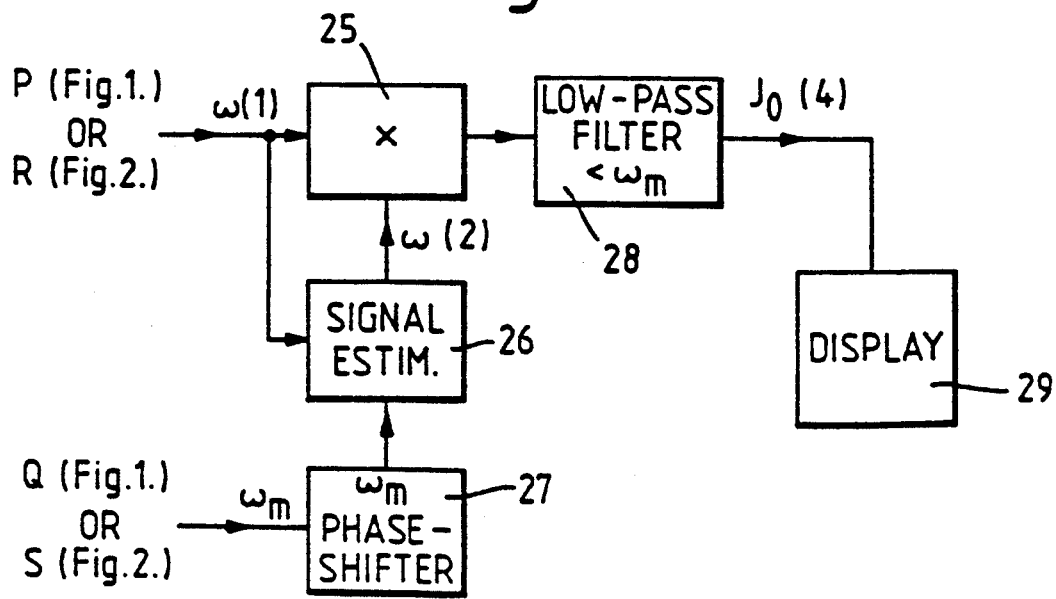
Figure 5:
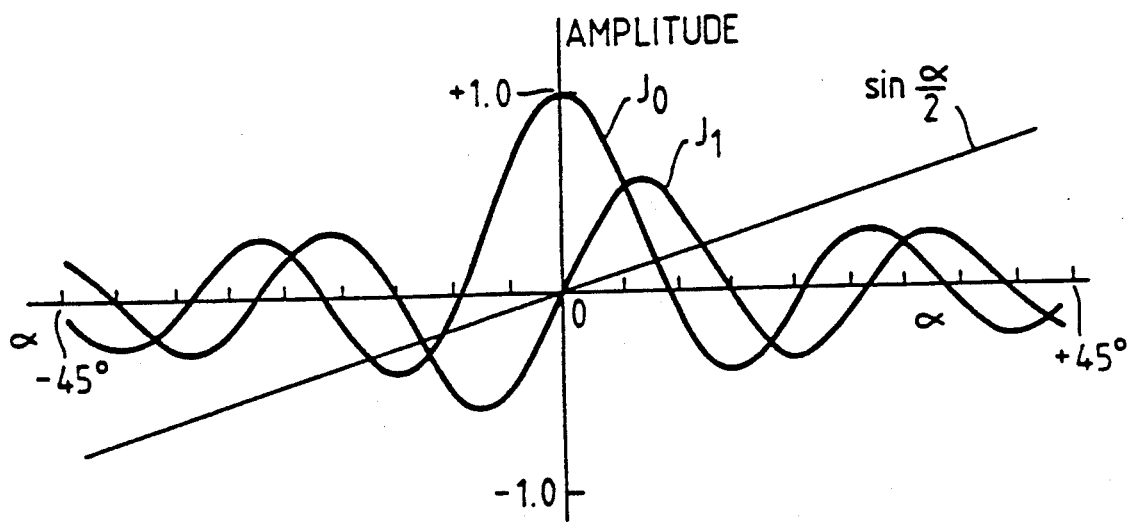
Figure 15:
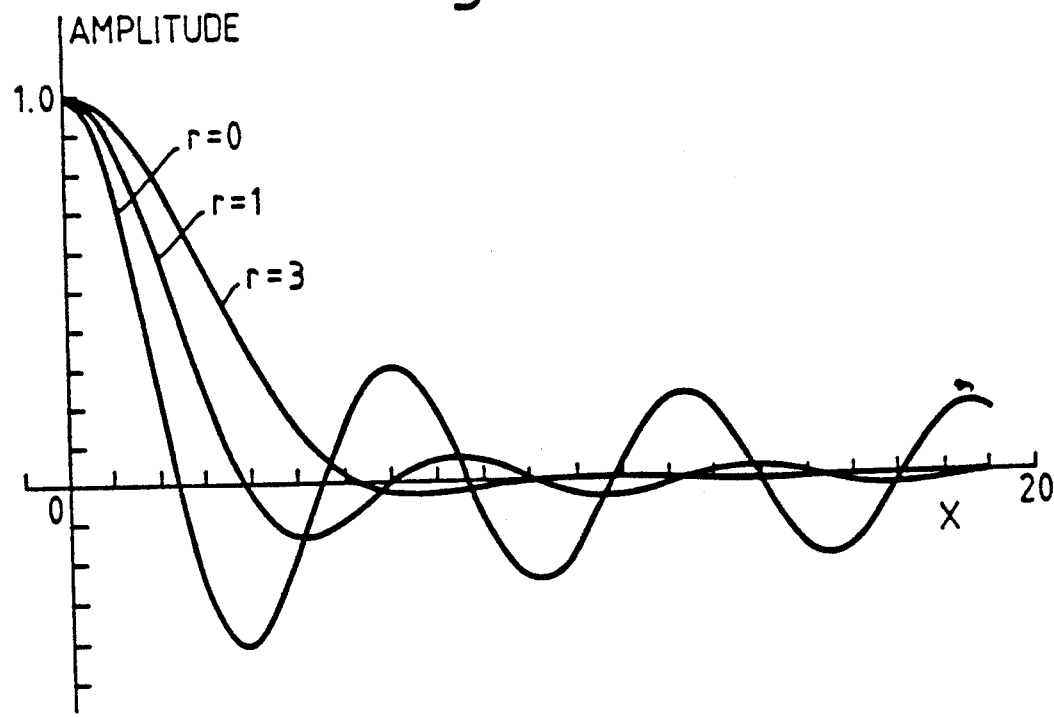
Figure 6:
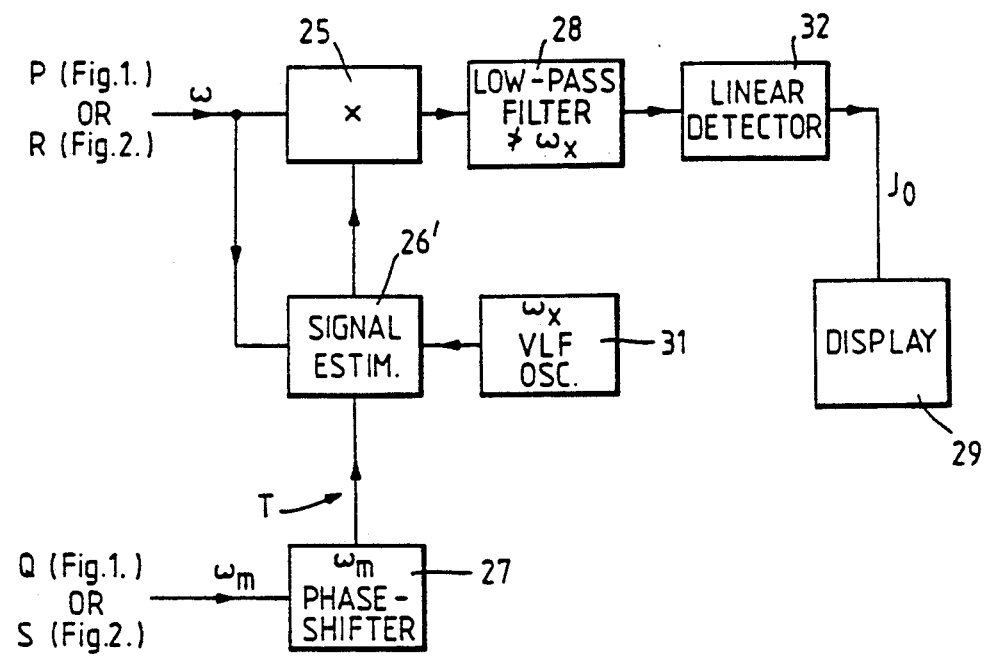
Figure 7:
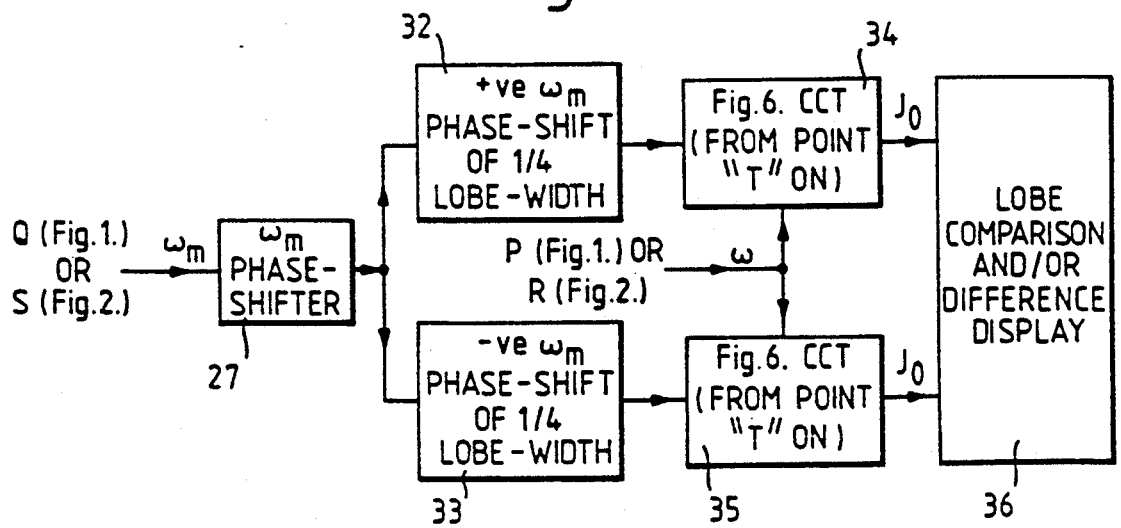
Figure 8:
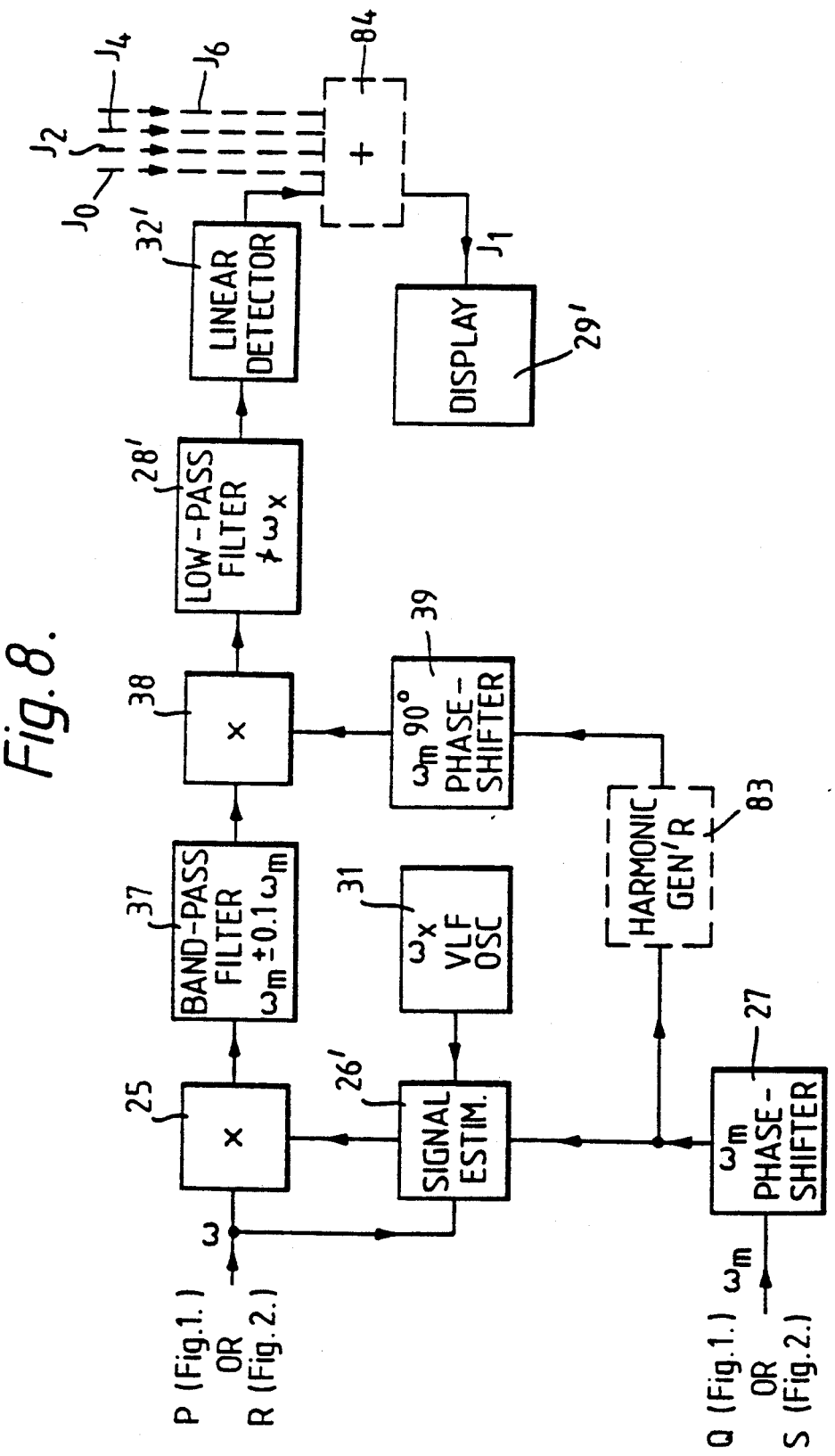
Figure 9:
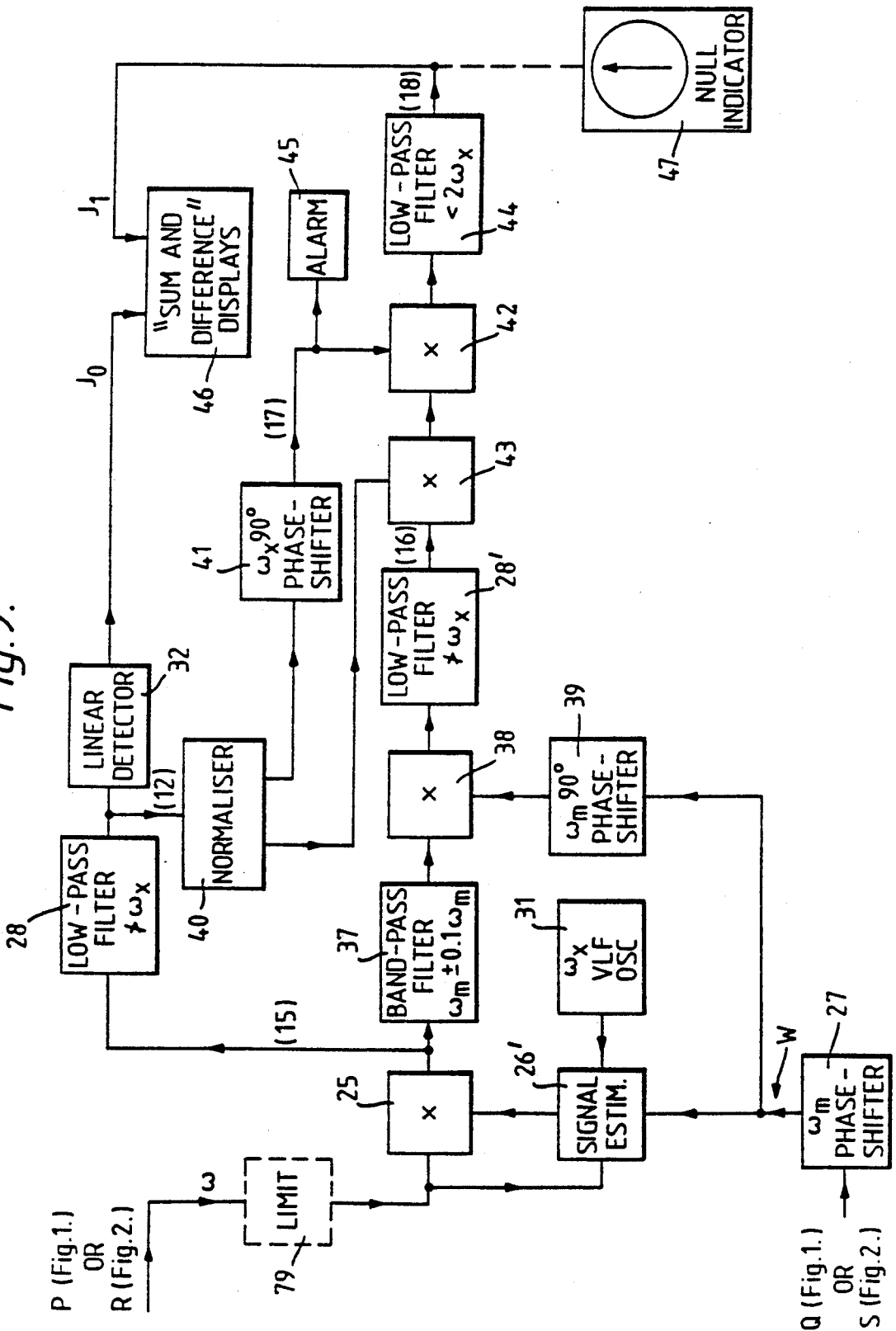
Figure 10:
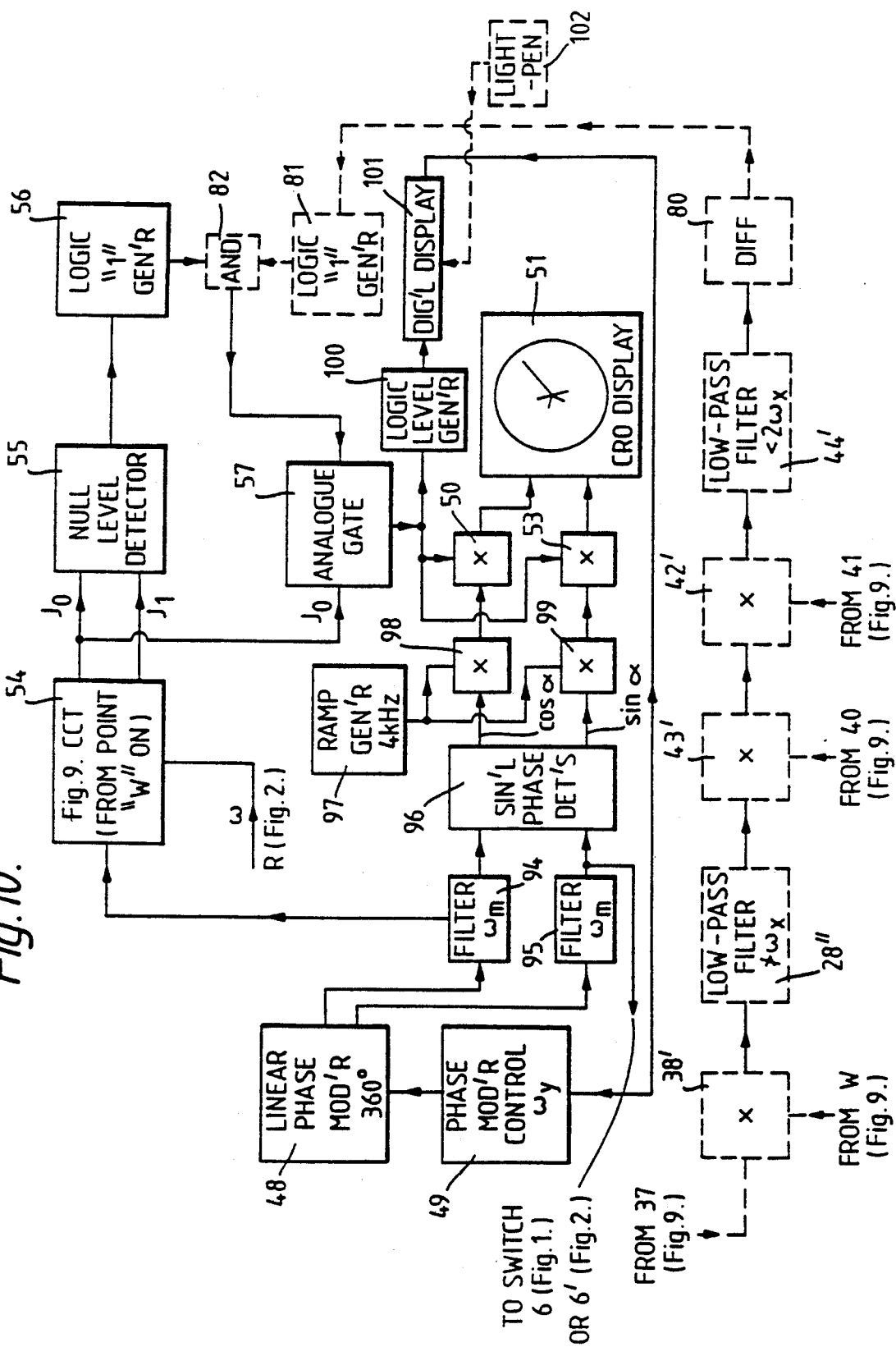
Figure 11:
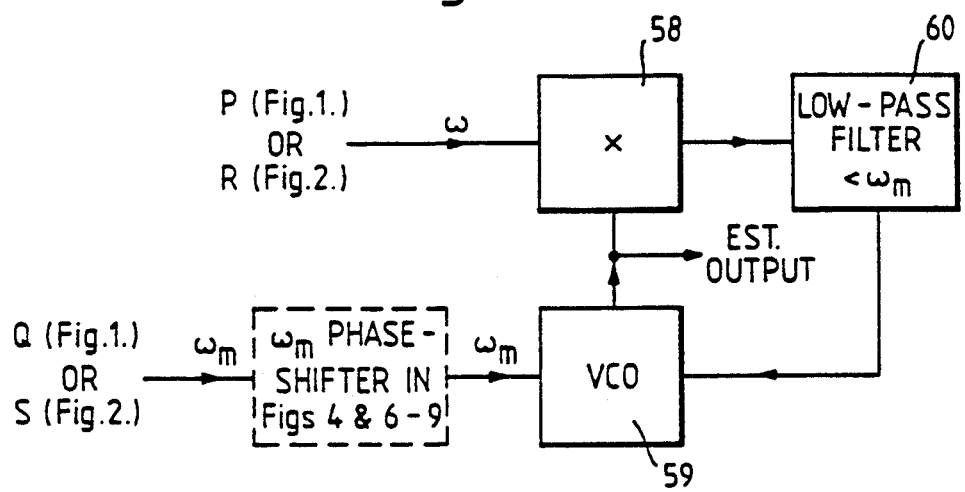
Figure 12:
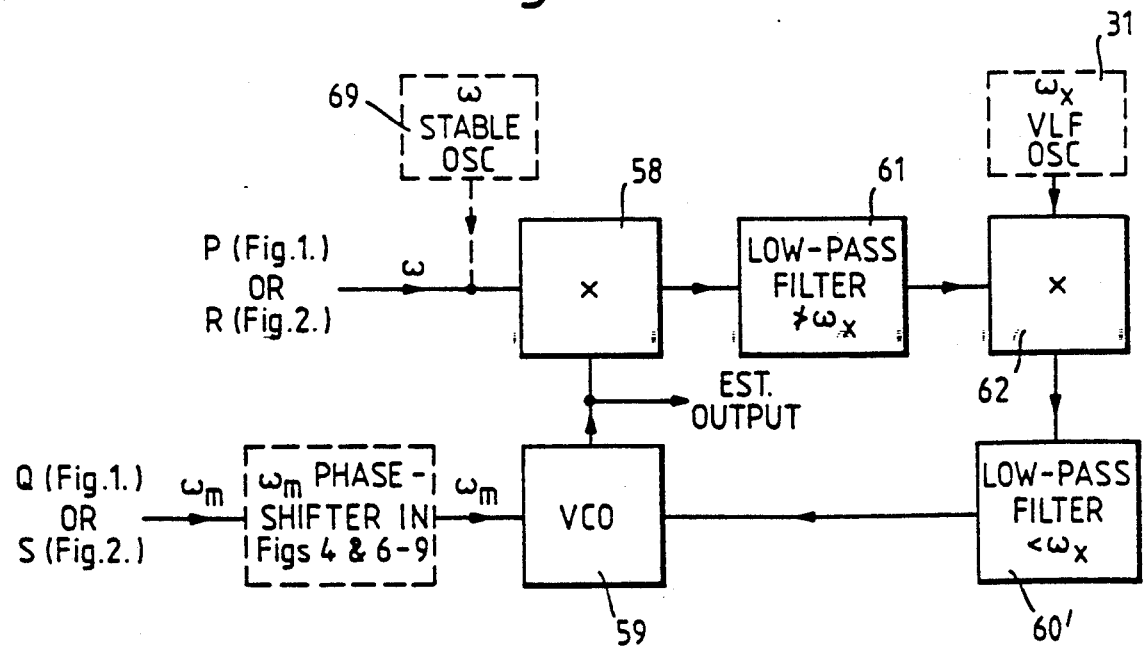
Figure 13:
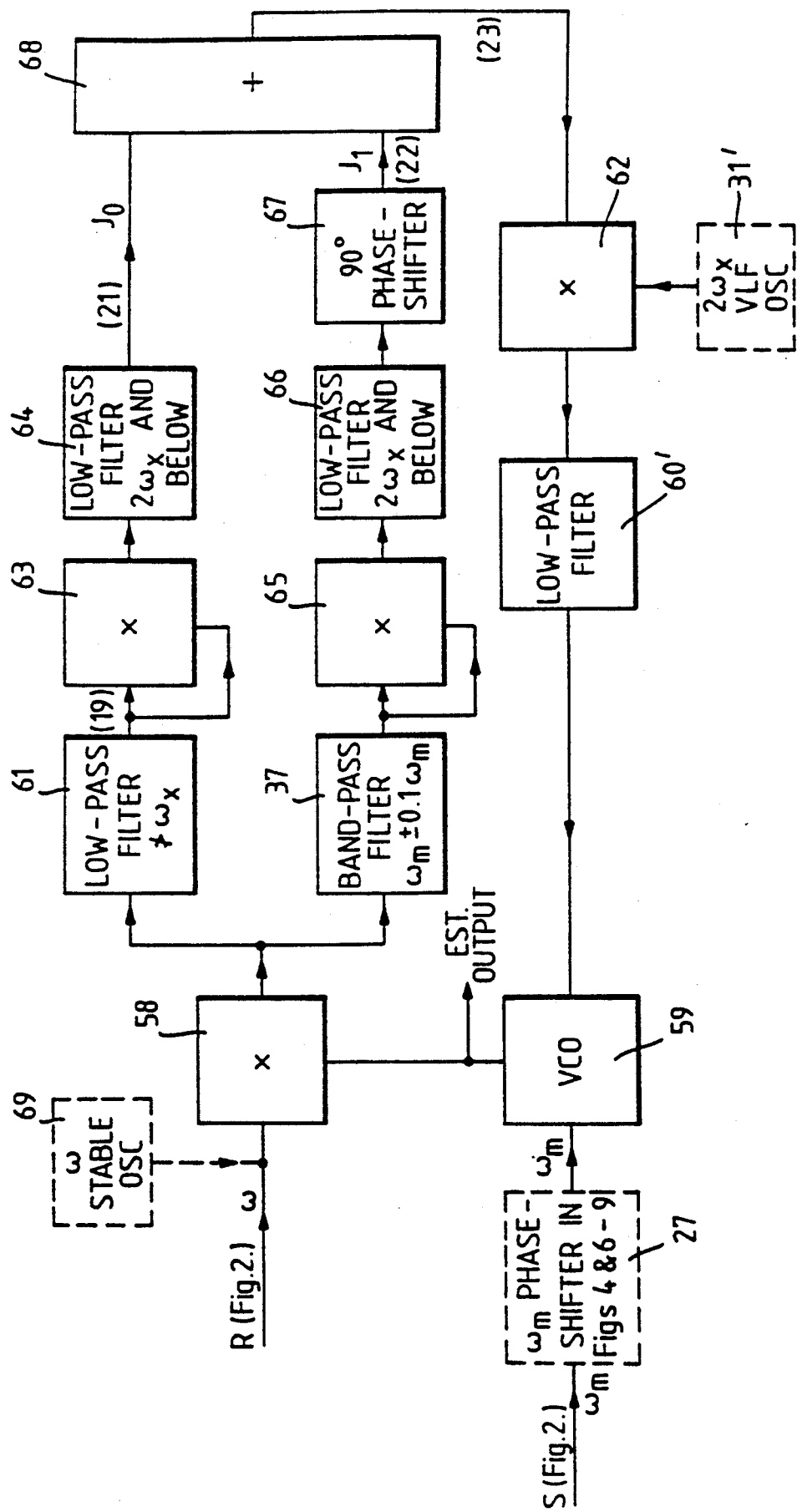
Figure 14:
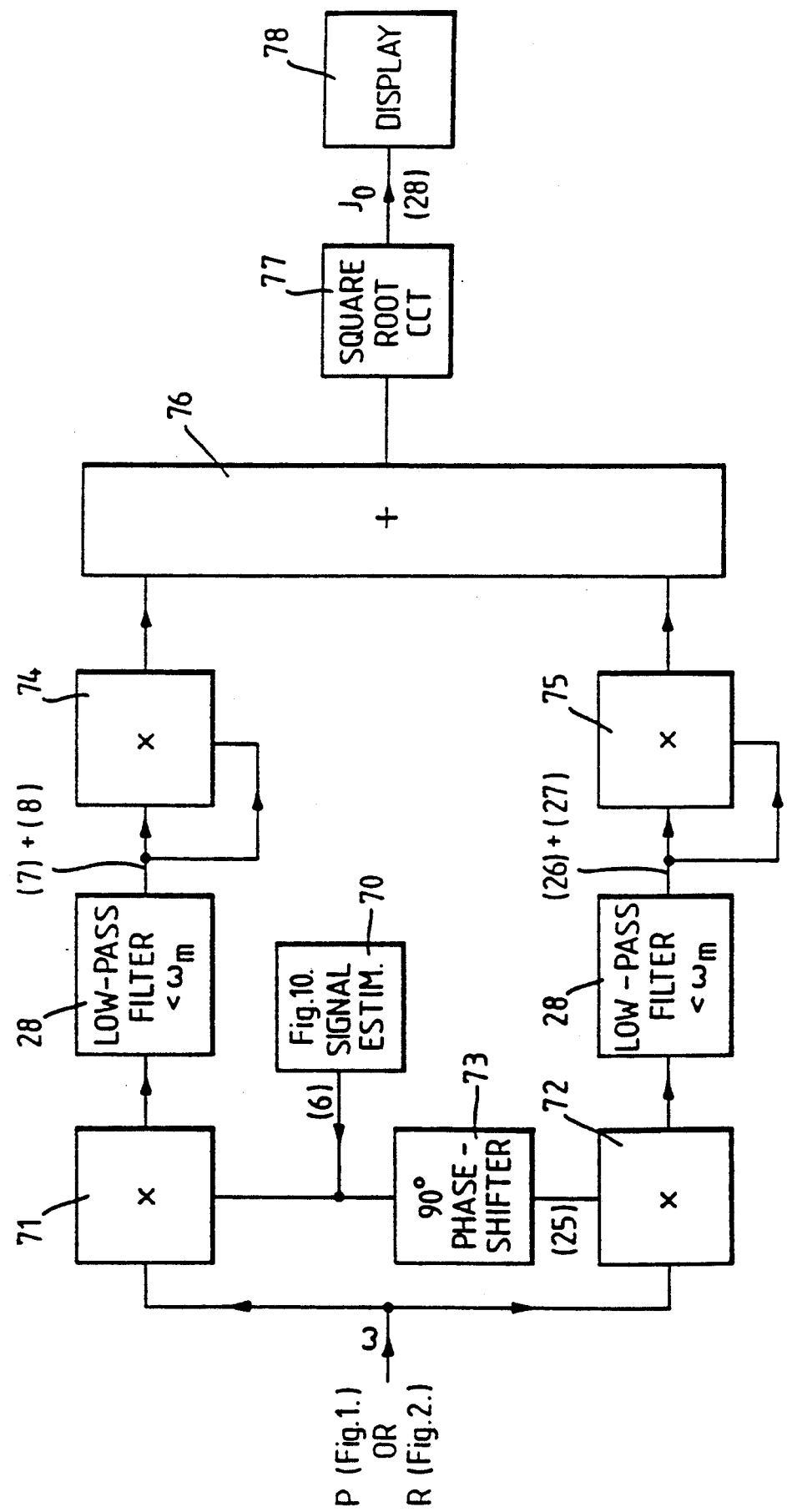
Figure 16:
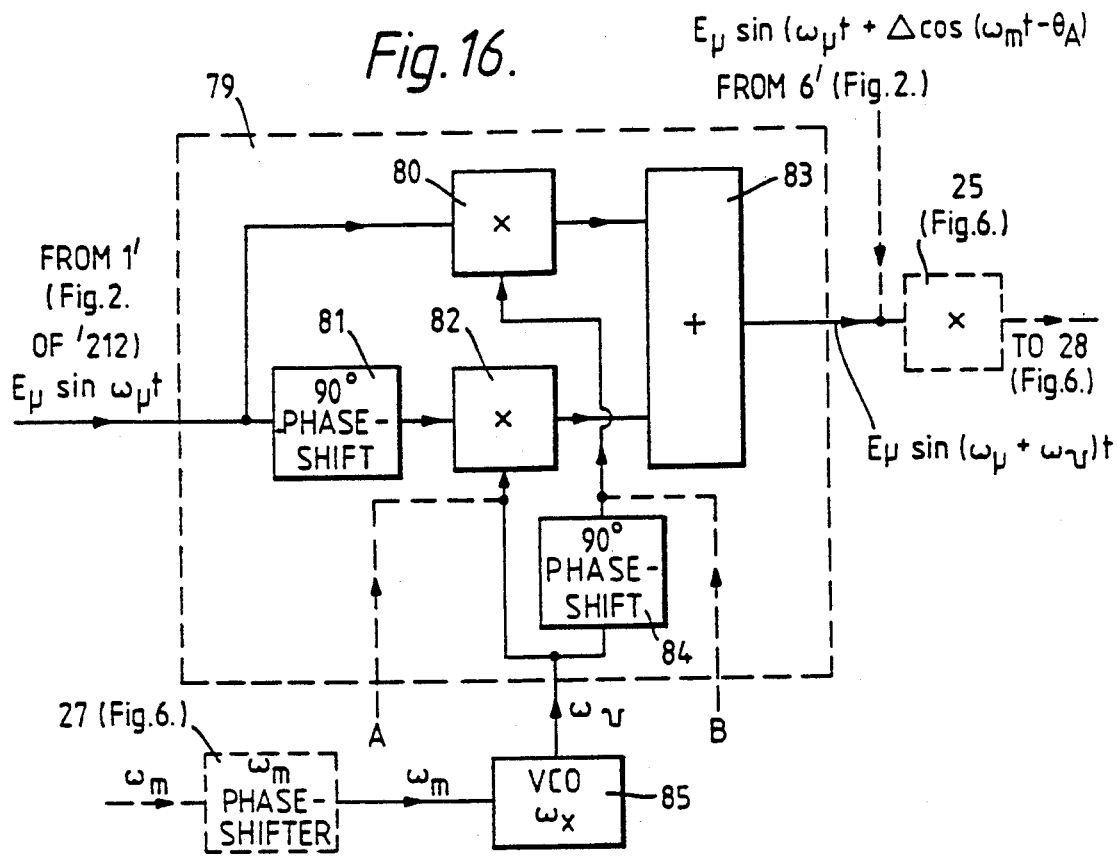
Figure 17:
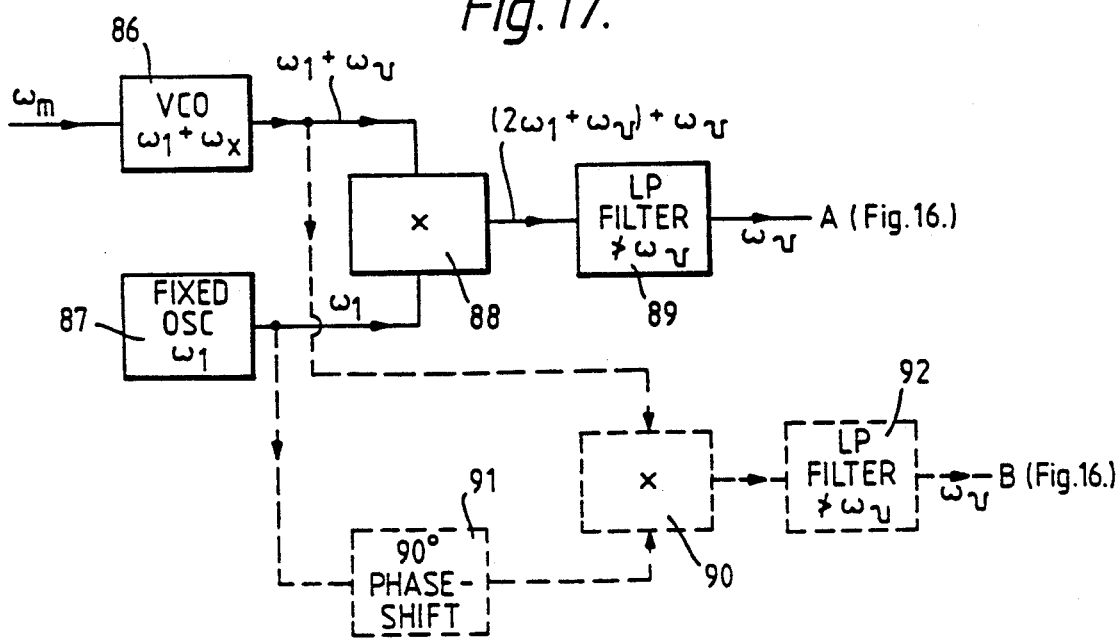

FIG. 3 is a diagram illustrating the method of bearing-determination used in FIGS. 1 and 2, FIG. 4 is a diagram of a basic circuit for lobe-generation by the method of the present invention, for detecting signal peaks, FIG. 5 shows graphs of polar diagrams obtainable with the present invention for a circular array, FIG. 6 is a diagram of a modification of the circuit of FIG. 4, for detecting signal peaks, FIG. 7 is a modification of FIG. 6 to give a lobe-comparison indication, FIG. 8 is a diagram of a modification of the circuit of FIG. 6, for detecting signal nulls, FIG. 9 is a diagram of a modified combination of the circuits of FIGS. 6 and 8 to give a "sum and difference" type of signal indication, FIG. 10 is a circuit diagram of a DF system embodying the present invention, FIG. 11 is a diagram of a basic circuit of a signal estimator for use in the present invention, FIG. 12 is a diagram of a modification of the circuit of FIG. 11, FIG. 13 is a diagram of a modification of the circuit of FIG. 12, FIG. 14 is a circuit diagram of an alternative modification of FIG. 4, FIG. 15 shows graphs of polar diagrams similar to FIG. 5 but for a linear array, FIG. 16 is a diagram of a further alternative form of signal estimator circuit, FIG. 17 is a modification of the circuit of FIG. 16.

Bracketed numbers in some Figures indicate that the signals at these points are represented by the corresponding equations in the description.

Synthetic-Aperture Aerials

In theory, any degree of polar-diagram directivity can be generated from any given aerial aperture of any arbitrary size. In practice, a given aperture will only allow the generation of a certain degree of directivity. This limitation arises because practical aerial and signal-processing systems have ohmic losses plus tolerance and calculation-accuracy problems respectively. In practical aerial arrays, the maximum directivity achievable with reasonable cost and complexity is that defined by a constant-amplitude and constant-phase illuminated aperture.

There are two basic aerial classifications involved in polar-diagram generation. The first is that of an array of aerial elements simultaneously feeding into, or fed from, a common point. Such an array is herein described as having a "real" aperture.

The second classification is that of one aerial element moved over a path which forms the "aperture". The signals representing the different RF amplitudes and/or phases thereby obtained, are subsequently processed to give, in effect, polar diagrams which would normally be consistent with the path aperture, subject to the limitations mentioned earlier. A familiar example of such polar-diagram generation is SAR (Synthetic Aperture Radar) as used by aircraft. Another form is the use of an apparent array of aerial elements of which, however, only one element is made active at any one time, by electronic or mechanical switching; this active element is scanned periodically about the aperture, so making it equivalent, in principle, to the aforementioned single moveable element. In the present Application the term "synthetic-aperture aerial" refers to aerial systems of the latter type.

Bearing Determination

The various known methods of bearing determination can be classified on the assumption that the directivity, from a real or synthetic aperture, takes the form of a lobe structure. These classifications are:

(a) The bearing determination is at the peak of the (main) lobe;

(b) The bearing determination is at the null (cusp) of a lobe structure;

(c) The bearing determination is by both peak and null, i.e., (a) and (b) above. This determination is often referred to as a "sum and difference" system because two polar diagrams, representing peak, (a), and null, (b), forms, are found by the addition and substraction respectively of two inputs from an array of elements forming a real aperture. A corresponding technique can be used with synthetic-aperture aerials. The operator can make these determinations sequentially, (a) being more rapid but (b) being more accurate because noise can blunt a peak more than a null.

(d) The bearing determination is at the cross-over of two polar diagrams (of either the peak type, (a), or, the null type, (b)) which are displaced in azimuth by such an angle as to provide equal signal strengths of reasonable amplitude at the cross-over.

The present invention allows all the above classifications of bearing determination to be used.

Prior Art

It is convenient to preface a description of the present invention by a description of the prior art with which it shares some features, in particular beacons and DF systems.

Prior Art Beacons

FIG. 1 shows a typical prior-art VOR system. On the ground a central omni-directional aerial 1 transmits continuously a VHF frequency, e.g., at 114 MHz, derived from an oscillator 2. This signal is amplitude-modulated (AM) in a transmitter 3 by a reference tone of, typically, 30 Hz, derived from an oscillator 4. A circular array of omni-directional aerials 5 surrounds aerial 1 and are activated in turn by an electronic switch shown symbolically at 6 and operated by the oscillator 4. Thus, in effect, a single omni-directional aerial scans round the circle, in this example clockwise, at 30 rev/sec. The VHF frequency is transmitted from each aerial 5 via a transmitter 7 in which it is not modulated by the 30 Hz tone but is frequency-shifted, typically by 10 kHz, by single-sideband generation; the latter shift facilitates separation of the signals from aerial 1 and aerials 5 respectively in the aircraft. The circumferential separation of the aerials 5 is not more than λ/2 at the VHF frequency by reason of the Nyquist criterion, and for a given circle diameter, i.e., aerial aperture, this determines the number of aerials 5.

In the aircraft the VHF signals are received by a receiver 8. The 30 Hz tone from aerial 1 is detected by an AM detector 9 and the signals from aerials 5 by an AM detector 10 which delivers a 10 kHz output whose phase depends upon which aerial 5 is instantaneously transmitting. This 10 kHz output is passed via an amplitude-limiter 11 to a frequency-modulation (FM) discriminator 12 to produce a 30 Hz signal whose phase depends, in a manner to be shown, on the bearing of the aircraft relative to the aerials 1 and 5. The bearing is determined by comparing this phase with that of the reference tone from aerial 1 in a display 13.

It will be seen that, in the aircraft, the phase-modulated 30 Hz modulation on the 10 kHz signal, produced by the rotary scanning of the aerials 5, is detected via an amplitude-limiter 11 and FM discriminator 12 in a conventional manner. The site-error performance of this arrangement, using apertures, i.e., array diameters, of about 30 electrical radians as in present VOR beacons, is good provided the limiter threshold is exceeded by the wanted received signal, i.e., received direct from the array, and the wanted signal is of greater amplitude than any unwanted signals resulting from reflections, as mentioned earlier. The performance is then equivalent to that obtainable from a real aperture equal to the array diameter. However, if the above conditions are not fulfilled, then the performance deteriorates badly and the array fails to act as a true synthetic aperture, i.e. equivalent to a real aperture, and may be termed a "pesudo-synthetic" aperture.

Prior-Art DF

In the main, prior-art DF systems using synthetic apertures employ the same principles as does the beacon of FIG. 1, through the law of reciprocity. However there are important practical differences and in the DF case the present invention can provide an important additional advantage, viz the use of one receiver instead of two.

FIG. 2 shows a known DF system comprising a circular array of aerials 1', 5' similar to that of FIG. 1 and similarly scanned by e.g. a 30 Hz oscillator 4' and switch 6', here operating in a receiving mode and receiving transmissions from a remote aircraft or other radiator 14, whose bearing is to be determined. The aerial outputs are fed to two receivers 15 and 16 respectively, whose local oscillators 17 and 18 differ in frequency by a small amount, typically about 10 kHz. The receiver outputs are mixed in a mixer 19 to produce a 10 kHz difference frequency which is fed via a band-pass filter 20 and amplitude-limiter 21 to an FM discriminator 22. As in the beacon case (FIG. 1), the discriminator output is a 30 Hz signal whose phase depends on the bearing of the radiator 14. This phase is compared with that of the 30 Hz scanning tone from oscillator 4', which is again the reference phase, to give the bearing in a display 23.

In principle, with a cooperating radiator 14 using a transmitter of very stable frequency, the aerial 1' and receiver 15 could be replaced by a stable local oscillator spaced in frequency by, in this example, 10 kHz from the radiator carrier frequency. In practice, radiators are not always cooperative and highly stable transmitters not easily achieved at present. This unpredictability of the transmitter-receiver link is the main practical difference between beacons and DF. One advantage of the present invention is that it can allow the omission of aerial 1' and receiver 15, i.e., the use of a single receiver for bearing determination.

The main problem with the DF system of FIG. 2 is that the site-error performance depends on the same factors as described in relation to the beacon of FIG. 1, resulting from the inclusion of the limiter 21.

Theory of Bearing Determination

The theory of the bearing determination method used in FIGS. 1 and 2 will now be described, since this theory is also involved in the method of the present invention. For convenience the DF case (FIG. 2) will be discussed, but the same theory applies reciprocally to the beacon case, as will be apparent to those skilled in the art.

In FIG. 3 the direct signal 24 received from a distant radiator 14 (not shown in FIG. 3) located along the O-Y axis (and geographical reference) and received by the aerial 5' can be expressed as $$\sin(\omega t + \Delta \cos \theta)$$

taking the amplitude for convenience as unity, where $\omega t$ is the "carrier" phase-angle (effectively 10 kHz in FIG. 2).

The term "carrier" is used broadly in this Application to denote a frequency which is phase- or frequency-modulated (in the invention these terms are synonymous) by the bearing information or other imposed frequencies; it is not limited to the propagated frequency itself though usually derived therefrom.

$\Delta$ is the distance of the aerial 5' from O, i.e. the aperture = $2\Delta$.

$\theta$ is the angular displacement of the aerial 5' from O-Y.

If, in effect, the aerial 5' is scanned round a circle of radius $\Delta$ at an angular rate $\omega_m$ (30 Hz in FIG. 2) such that, at time t=0, the activated aerial 5' lies on O-Y, then $$\theta = \omega_m t$$

If the angle subtended by the radiator 14 changes to $\theta_A$ relative to O-Y as shown at 24', then the signal received by the scanned aerial 5' becomes $$\sin(\omega t + \Delta \cos(\omega_m t - \theta_A)) \qquad (1)$$

In FIG. 2 the value of $\theta_A$, the radiator bearing, is determined by means of the circuit described.

The Present Invention

Beacons and DF systems using real apertures do not normally include a limiter and their accuracy is therefore not so constrained as for the pseudo-synthetic apertures formed in FIGS. 1 and 2. With real apertures the wanted direct signal and the unwanted reflected signal are separable and the site-error is therefore given by simple calculation based upon the amplitude-ratio of the received signals. In the pseudo-synthetic systems of FIGS. 1 and 2, where e.g., the stronger signal will capture the detection process, the site-error is derived from more complex calculations based upon standard FM communication theory. DF systems using real apertures are in use but are not always convenient for 360° coverage. VOR beacons likewise normally need 360° coverage, which limits the use of real-aperture arrays. The use of true synthetic-aperture systems would thus be beneficial, and such systems, not necessitating an amplitude-limiter, will now be described.

Polar Diagram Derivation - Lobe Maximum

FIG. 4 shows a basic circuit embodying the present invention, for processing the received signals in either beacon or DF systems. Its inputs are derived from points P and Q in FIG. 1, or points R and S in FIG. 2, the circuitry preceding these points being unchanged from the prior art, but the succeeding circuitry being replaced.

The carrier input $\omega$, phase-modulated by the reference tone $\omega_m$ according to the bearing as in equation (1), is fed to a multiplier 25 to which is also fed the output of a signal estimator 26. As is known to those skilled in the art, a multiplier includes a non-linear element or elements and, according to design, can function as a multiplier per se, a balanced modulator, a balanced mixer, a detector or, when followed by a low-pass filter to select DC, as a correlator. Here multiplier 25 itself functions as a balanced mixer and, plus filter 28, as a correlator. This "estimator", to be described later, generates a signal which is "estimated" to be that of the wanted signal as regards bearing. (The terms "estimate" and "estimator" are used for convenience of explanation, but frequently an estimate in the usual sense of a good guess cannot be made, e.g., in a DF system scanning continuously over 360°).

Let it be assumed initially that the carrier of the estimated signal, derived in FIG. 4 from the input to multiplier 25, is locked in frequency and phase (other than deliberately introduced phase-variations—see below) with that input, although this is not essential as will be seen.

Estimator 26 also receives an input from a phase-shifter 27 fed by the reference tone $\omega_m$, and by this means the modulation phase of the estimated signal can be deliberately altered. The output of multiplier 25 is fed to a low-pass filter 28 which removes components of $\omega_m$ and above, and its DC output (the correlation function of the two multiplier inputs) is applied to a display 29. (Strictly speaking, with perfect phase-locking between the input and estimated signals the filter 28 can cut off at $2\omega_m$. However, as explained later, such correct phasing is difficult to achieve and hence $\omega_m$ terms are be likely in the output of multiplier 25. Thus it is advisable to make filter 28 cut off at $\omega_m$.) In operation the modulation phase of the estimated signal is altered as above until this DC output is a maximum, and this phase-shift of $\omega_m$ is compared with its reference phase, i.e., to the phase of the input to phase-shifter 27, the difference between them being equal to the bearing.

The theory of the method of FIG. 4 is as follows. Recalling that the received input to multiplier 25 is given by equation (1), the estimator 26 is made to produce an estimated signal of the form $$\sin(\omega t + \Delta \cos(\omega_m t - \theta_A + \alpha)) \qquad (2)$$

where $\alpha$ is a small (for the moment) angle which in effect represents the unknown in an estimation of $\theta_A$. An estimation has thus been made of the received aerial signal (i.e., of the carrier $\omega_m$ plus bearing sidebands only, excluding any information, e.g., speech, sidebands) in the approximate direction of the target.

The above cross-correlation of signals (1) and (2) gives an output from filter 28 of $$J_o\left(2\Delta \sin \frac{\alpha}{2}\right) + 2J_2\left(2\Delta \sin \frac{\alpha}{2}\right)\sin 2\left(\omega_m t - \theta_A + \frac{\alpha}{2}\right) + \qquad (3)$$

$$2J_4\left(2\Delta \sin \frac{\alpha}{2}\right)\sin 4\left(\omega_m t - \theta_A + \frac{\alpha}{2}\right)$$

where $J_0$, $J_2$, $J_4$ ... are Bessel Functions.

Strictly speaking, the product of the cross-correlation is the time-invariant (i.e., DC) term $$J_o\left(2\Delta \sin \frac{\alpha}{2}\right) \qquad (4)$$

and the higher-order Bessel Functions ($J_2$, $J_4$, etc), which have terms containing $\omega_m$, $2\omega_m$, etc, are removed by filter 28.

The zero-order Bessel Function (4) represents a mainlobe and sidelobe polar diagram whose beam-widths and amplitudes are dependent on the value of $\Delta$, the diameter of the array. FIG. 5 shows the shape of this $J_0$ polar diagram, for an aperture $2\Delta = 30$ electrical radians, which is seen to have a maximum mainlobe value when $\alpha = 0$, i.e., when the estimated bearing is the true bearing $\theta_A$. Thus if phase-shifter 27 is adjusted by the operator until the output from filter 28 is a maximum, $\alpha$ has in effect been reduced to zero and the phase-shift applied to $\omega_m$ is equal to the true bearing $\theta_A$.

More generally, if $(\theta_A + \alpha)$ is treated as a complete variable, rather than as an estimate, then equation (4) represents a mainlobe/sidelobe polar diagram which can be rotated to any selected mainlobe bearing by adjusting the phase of $\omega_m$, i.e., maximum output will be obtained when the received signal is at the selected bearing. Two or more such diagrams can be derived and rotated using a single array.

Thus a true synthetic-aperture system has been realised. Calculation of the site-error performance shows that, for a wanted signal of greater amplitude, the results are virtually identical with those of the pseudo-synthetic aperture case of FIGS. 1 and 2, assuming in the latter case that the wanted signal amplitude is above the limiter threshold level. However, in the present true synthetic case, the accuracy is maintained for all signal amplitudes, even below those defined as the minimum values for the limiter in the pseudo case. Moreover, where the level of an unwanted reflected signal, indicated at 30 in FIG. 3 at bearing $\theta_K$, or signals is greater than the wanted signal, a higher performance is obtainable in the true case because the signal-processing is biased towards the wanted signal whereas in the pseudo case the stronger unwanted signal will, via the limiter, capture the processing completely. There are several practical situations in which unwanted reflections can be stronger. In the present true case all signal amplitudes are treated separately according to their positions in the polar diagram as well as their levels, which is the same as the situation with real-aperture arrays and thus gives a similar site-error performance.

Phase of Estimated Carrier

The description of FIG. 4 assumed that the phase of the carrier $\omega$ of the estimated signal generated in estimator 26, neglecting its deliberate variation via phase-shifter 27 (i.e., introduction of $\alpha$ in equation (2)), was locked to that of the received signal. This is possible, as shown in the later description of the estimator, but as the resulting phase-lock would be with the composite phase of the wanted plus any unwanted reflected signal(s), variations of the composite phase from the phase of the wanted signal could produce errors which might negate the potential performance of the present true synthetic-aperture system. A preferred method of overcoming this difficulty is illustrated in FIG. 6. (An alternative, non-preferred, method is described later with reference to FIG. 14.)

Before describing the method of FIG. 6, the preceding theory will be expanded to include the following additional terms.

$k$ = amplitude of an unwanted reflected signal, likely to cause site errors, relative to the amplitude (unity) of the wanted signal, $\phi$ = phase angle by which the estimated signal (neglecting any deliberate phase-shifting of its $\omega_m$ component) differs from the phase of the wanted signal, $\phi_k$ = phase angle by which the estimated signal (neglecting any deliberate phase-shifting of its $\omega_m$ component) differs from the phase of the unwanted reflected signal, $\theta_k$ = bearing angle of the unwanted reflected signal (see signal 30 in FIG. 3).

Then the following previous, expanded and additional equations can be written:

$$\text{Wanted signal} = \sin(\omega t + \Delta \cos(\omega_m t - \theta_A)) \quad (1)$$

$$\text{Unwanted signal} = k \sin(\omega t + \phi_k + \Delta \cos(\omega_m t - \theta_k)) \quad (5)$$

$$\text{Estimated signal} = \sin(\omega t + \phi + \Delta \cos(\omega_m t - \theta_A + \alpha)) \quad (6)$$

The wanted output of filter 28 is then $$\approx \cos\phi \, J_o\left(2\Delta \sin\frac{\alpha}{2}\right) \quad (7)$$

plus an unwanted output $$\approx k\cos(\phi - \phi_k) J_o\left[2\Delta \sin\left(\frac{\alpha - (\theta_A - \theta_k)}{2}\right)\right] \quad (8)$$

Equations (7) and (8) represent the separable signals as received by the polar diagram of the first-order Bessel Function, i.e., they can be separately maximised and observed at their respective bearings. This is similar to the situation with a real aperture, but there is an important difference as follows.

With a real aperture the wanted and unwanted signals are detected by a linear detector to give a signal of amplitude $$\sqrt{P^2 + 2kPP_k \cos\phi_k + k^2 P_k^2} \quad (9)$$

where P and $P_k$ are polar diagram factors equivalent to $$J_o\left(2\Delta \sin\frac{\alpha}{2}\right) \text{ and } J_o\left(2\Delta \sin\left[\frac{\alpha - (\theta_A - \theta_B)}{2}\right]\right)$$

respectively in equations (7) and (8) relating to the present invention.

Note that, if k is small, by expanding (9) the amplitude can be written as $$P + P_k k \cos\phi_k \quad (10)$$

whose first and second terms correspond physically to equations (7) and (8) respectively, i.e., the stronger, wanted, signal is detected as if $\phi$ (here taken as the phase difference between the wanted signal and some reference signal) were zero; this is to be expected since in linear detection the strongest signal in effect acts as its own reference.

The detection situation as expressed by equation (9) is thus different from that of (7) plus (8) since in the latter case $\phi$ and $(\phi - \phi_k)$ can, taking the worst case, be 90° and 180° respectively, which would produce a gross error, viz equation (7) becomes zero, rather than the finite error of equation (9). If $\phi$ could be made zero this problem would be overcome, but this is difficult to achieve. FIG. 6 illustrates a method of overcoming it in which misphasing is accepted but a continuous low-frequency cyclic change of such phasing is arranged so that averaging takes place.

FIG. 6 is similar to FIG. 4 except that the estimator 26' receives a low-frequency signal $\omega_x$, suitably about 5 Hz, from a very low frequency (VLF) oscillator 31; the low-pass filter 28 removes frequencies of $\omega_m$ and upwards but passes $\omega_x$, and is followed by a linear detector 32. The theory of operation is as follows.

In the estimator 26' (to be described) the estimated signal (6) is replaced by $$\sin(\omega t + \phi + \omega_x t + \Delta \cos(\omega_m t - \theta_A + \alpha)) \quad (11)$$

i.e., a cyclic phase term $\omega_x t$ has been added to the phase of the generated carrier $\omega$. After cross-correlation with signals (1) and (5) as described with reference to FIG. 4, equations (7) and (8) are respectively replaced by $$\cos(\omega_x t + \phi) J_o\left(2\Delta \sin \frac{\alpha}{2}\right) \quad (12)$$

and $$k\cos(\omega_x t + \phi - \phi_k) J_o\left[2\Delta \sin\left[\frac{\alpha - (\theta_A - \theta_k)}{2}\right]\right] \quad (13)$$

Amplitude detection of (12) plus (13) in detector 32 gives $$\sqrt{J_o^2 + 2kJ_{ok}J_o\cos\phi_k + k^2J_{ok}^2} \quad (14)$$

where $J_0$ and $J_{0k}$ replace the full Bessel functions for convenience, i.e., an expression equivalent to that of equation (9) for a real aperture.

Equations of the type of (7) and (8) are approximations in that the higher-order terms $J_2$, $J_4$, etc of equation (3), and $J_1$, $J_3$ etc in later equations in this description, which contain $\omega_m$, $2\omega_m$, etc components, are neglected. In order to prevent terms of $\omega_m \pm \omega_x$ or $\omega_x \pm \omega_m$ getting through filter 28, it is necessary to limit $\omega_x$ to very low frequencies relative to $\omega_m$ or to very high frequencies relative to multiples of $\omega_m$, and in the here-described form low values are used, e.g., 5 Hz for $\omega_x$, relative to 30 Hz for $\omega_m$.

The wanted output of filter 28 in FIG. 6 contains the $J_0$ polar diagram term of equation (7), but this term is now multiplied by a low-frequency $\omega_x$ term instead of the phase-dependent DC term, $\cos \phi$, as in FIG. 4. The higher the value of $\omega_x$, the faster the obtainable bearing determination, and hence the easier to follow rapid variations in target bearing. However, in practice $\omega_x$ must be limited as a proportion of $\omega_m$ in order to avoid sideband aliaising (the known undesirable overlapping of sidebands).

Lobe Comparison

Determining the maximum value of equations (7), (8), etc, corresponding to the lobe peak, is not always the most convenient method of practical operation, as is also true of real-aperture operation. It takes time to access the maximum of a polar diagram unless some fast automatic scanning system is used, such as rapidly varying $\omega_m$. Such scanning plus suitable processing could be arranged, but low values of $\omega_m$ and $\omega_x$, as described, leave little scope in this respect, and such a system could also be complex. A preferable method is to generate two lobes spaced by, suitably, one-quarter of the lobe beamwidth, and then determine the bearing by obtaining equal signal amplitudes at the mid-point, i.e., using the classification (d) technique described earlier.

FIG. 7 shows a circuit using the above method. The output of phase-shifter 27 is fed to two further phase-shifters 32, 33 which respectively add and subtract fixed phase-shifts corresponding to one-quarter of the lobewidth. Their respective outputs are fed to two FIG. 6 circuits, 34 and 35, at the point T therein, in place of the single existing phase-shifter 27, and the outputs of the two FIG. 6 outputs are compared for equality, and/or substracted to obtain zero, in a display 36.

Polar Diagram Derivation - Lobe Null

The description so far has been concerned with the derivation and utilisation of lobe maxima. However, the present invention also allows null methods to be used, corresponding to the classification (b) technique described earlier.

A circuit for deriving lobe nulls is shown in FIG. 8. This is similar to FIG. 6 as regards components 25, 26', 27 and 31, but filter 28 is replaced by a band-pass filter 37 centred on $\omega_m$ of bandwidth $\pm 0.1$ $\omega_m$. The filter output is fed via a multiplier 38 (similar to multiplier (balanced mixer) 25) to a low-pass filter 28' which rejects above $\omega_x$, a linear detector 32' and a display 29' similar to the corresponding components of FIG. 6. Multiplier 38 receives a second input from phase-shifter 27 via a 90° phase-shifter 39. Whereas FIG. 6 derived a zero-order Bessel Function having a maximum value at the target bearing, FIG. 8 derives a first-order Bessel Function having zero value at the target bearing.

Omitting for the moment phase-shifter 39 and replacing multiplier 38 by a linear detector, the theory relating to FIG. 8 is as follows. A closer approximation than equation (12) for the output of multiplier 25, neglecting $2\omega_m$, $3\omega_m$, etc, terms, is $$\approx \cos(\omega_x t + \phi)\left(J_o\left(2\Delta \sin \frac{\alpha}{2}\right) + \sin(\omega_x t + \phi) J_1\left(2\Delta \sin \frac{\alpha}{2}\right)\right) \quad (15)$$

$$\sin\left(\omega_m t - \theta_A + \frac{\alpha}{2}\right)$$

The first, $J_0$, term of (15) represents a polar diagram with the peak of the main lobe aligned on the target bearing as already described. The second, $J_1$, term has a null when $\alpha = 0$ and thus represents a null-type polar diagram, and this term is selected by the filter 37. This $J_1$ polar diagram is shown in FIG. 5 for the same diameter aperture, $2\Delta$, as the $J_0$ diagram.

It will thus be seen that a $J_1$ polar diagram is obtainable by omitting phase-shifter 39 and its connections and replacing multiplier 38 by a linear detector, and this will normally suffice. The optional components 38 and 39 may be included, however, if it is desired to reduce the noise level by, in effect, reducing the bandwidth to much below $\pm 0.1$ $\omega_m$. The design of very narrow bandpass filters as such is difficult and reduction to a bandwidth based on $\omega_x$ can be achieved by the addition of the above components. In this case the second term of equation (15) becomes $$\sin(\omega_x t + \phi) J_1\left(2\Delta \sin\frac{\alpha}{2}\right) \sin\left(\omega_m t - \theta_A + \frac{\alpha}{2}\right)$$

$$\sin(\omega_m t - \theta_a + \alpha),$$

the last factor being the 90° phase-shifted reference tone $\omega_m$. This reduces to $$\sin(\omega_x t + \phi) J_1\left(2\Delta \sin\frac{\alpha}{2}\right)\cos\frac{\alpha}{2} \qquad (16)$$

after filtering-out the $2\omega_m$ terms in filter 28', i.e., the bandwidth in now related to $\omega_x$ instead of to $\omega_m$.

A corresponding noise-reduction technique is not required in deriving the $J_0$ polar diagram, because filter 28 in FIGS. 5 and 6 is a low-pass filter anyway. The FIG. 8 arrangement also has the advantage that it reduces far-out sidelobes in accordance with the factor $\cos \alpha/2$ in equation (16).

The null system in FIG. 8 gives an output which is ambiguous as regards left-right determination of each side of the null because of the term $\sin (\omega_x t + \phi)$ in equation (16). This is adequate for some purposes and similar to real-aperture practice in which this absence of polarity-sense can only be overcome by preserving the relative RF phases of the lobe and null polar diagrams. With the present method this problem is more easily overcome, and a circuit which does so is shown in FIG. 9. This circuit derives both $J_0$ and $J_1$ outputs, and corresponding components of already-described circuits are given similar reference numbers. Thus a $J_0$ output is obtained from detector 32 as in FIG. 6 and a (pre-detection) $J_1$ output from filter 28' as in FIG. 8. The $J_1$ channel includes the noise-reducing components 38, 39 and 28' of FIG. 8 as already described.

The $J_0$ output of filter 28, essentially equation (12), is fed to a normaliser 40, e.g., of the kind described in copending application Ser. No. 8712556, whose AC output is fed via a 90° phase-shifter 41 to obtain a signal $$\sin(\omega_x t + \phi) J_o\left(2\Delta \sin\frac{\alpha}{2}\right) \qquad (17)$$

of relatively constant amplitude which is fed to a multiplier 42 similar to multipliers 25 and 38, functioning here as a balanced modulator. The bar in equation (17) indicates this relatively constant amplitude, reasonably independent of $\alpha$ and approximating to, or proportional to, unity. Multiplier 42 also receives the output of filter 28' (equation (16)) after the latter has been multiplied in a multiplier 43 by a DC output of normaliser 40 (suitably from the divider in FIG. 2 of said Application), whose value depends inversely on the amplitude of signal (12). Thus if signal (16) should fall in amplitude due to fading, it is restored in value by multiplier 43 owing to multiplication by the corresponding increased DC output of normaliser 40. The inclusion of multiplier 43 is optional and may not be necessary if e.g., the receiver AVC circuits are adequate. It is important in seeking nulls that signal fading should not be confused with approach to the null. The normaliser/multiplier arrangement can usefully be included whether sense-resolution is required or not, in order to keep the output of filter 28' at a steady level.

The product formed in multiplier 42 is $$J_1\left(2\Delta \sin\frac{\alpha}{2} \sin(\omega_x t + \phi)^2 \cos\frac{\alpha}{2}\right.$$

which, after detection in the multiplier and removal of $\omega_x$ terms in filter 44 yields the DC output $$J_1\left(2\Delta \sin\frac{\alpha}{2}\right)\cos\frac{\alpha}{2} \qquad (18)$$

corresponding to synchronous detection with respect to $\omega_x$ since, when $\alpha$ is small, equation (18) becomes approximately $$\sin\frac{\alpha}{2} \cdot \cos\frac{\alpha}{2} = \sin \alpha,$$

which changes sign with $\alpha$.

The polarity of output (18) is opposite on opposite sides of the null, thereby removing the left-right ambiguity. This removal is absolute provided the $J_0$ signal to normaliser 40 does not go actually to zero when off the target bearing, and an alarm 45 is included to detect this zero condition; otherwise the normaliser 40 prevents the sensitivity of the $J_1$ output being greatly dependent on the off-bearing $J_0$ output. In FIG. 9 $J_0$ and $J_1$ outputs are both utilised and fed to a "sum and difference" type of display 46; alternatively the null output alone can be utilised and fed to a centre-zero type of display 47.

Application to Beacons

The arrangements described so far are applicable to both DF and beacon systems, e.g., VOR beacon systems. The present section relates particularly to their application to beacons, i.e., the inputs are from points P and Q in FIG. 1 and the aforesaid polar diagram generating circuits are in the aircraft.

In the known VOR beacon of FIG. 1, the 30 Hz reference tone is used to give a null indication in display 13 of the aircraft being on a selected radial course, i.e., bearing. On either side of this course the indication is negative or positive, depending on which side, so allowing manual or automatic course-following. With the present invention, the lobe-comparison method of FIG. 7 can be used similarly with existing ground-stations, if one lobe is notated positive and the other negative; addition of the outputs in display 36 then gives the required null indication.

Usually the aircraft knows its approximate position and wishes to fly towards the beacon on a radial course. In that case the operator in the aircraft sets the phase of $\omega_m$, by means of phase-shifter 27, to give the required value of $\theta_A$ for that course, and the pilot flies a path which gives this null indication (or, in other forms of the invention, a lobe maximum indication, as described).

Beacon systems can also be used, however, for approximate cross radial course navigation, e.g., to attain a position from which the eventual radial course is to be followed. For such cross radial course navigation it may be advantageous, with existing ground-stations, to retain the existing airborne equipment in FIG. 1, i.e., including limiter 11 and discriminator 12, adding-on the FIG. 7 arrangement to obtain a more accurate final radial course. This is because the existing FIG. 1 system readily allows bearing information to be obtained continuously over a 360° arc, which is useful for cross radial course navigation. The present invention is less accommodating in this respect since the FIG. 5 pattern would have to be scanned continuously over 360° or part thereof to provide this information; the low values of tone frequency $\omega_m$ (30 Hz) used in existing ground-stations make this difficult, because the gap between this frequency and a phase-cycling frequency ($\omega_x$) of 5 Hz is insufficient to readily accommodate a scanning frequency.

A preferred "add-on" alternative to that of FIG. 7 is the resolved-null system of FIG. 9, minus components 32 and 46 since no $J_0$ output is needed, and with the resolved $J_1$ output feeding the centre-zero display 47 as described. This arrangement has the same continuous scanning difficulty with existing ground-stations as does FIG. 7.

With a completely new beacon system, including new ground-stations adapted to the present invention, the retention of the existing FIG. 1 airborne equipment becomes unnecessary, even for cross radial course navigation. Moreover it can be shown that the elimination of the limiter allows the phase modulation index (i.e., the maximum frequency deviation of the carrier in one direction divided by the modulating frequency) to be increased without involving the known FM noise threshold effect (i.e., when the signal/noise ratio falls below a threshold value) which normally becomes increasingly deleterious as the modulation index increases. A permissible increase of this index allows a corresponding increase of the aperture 2Δ, either by a physical increase of the array diameter or, usually more conveniently, by an increase in operating frequency, leading to greater bearing accuracy. Also, the tone frequency $\omega_m$ can be greatly increased to e.g., 1000 Hz or higher, again without degradation by the above FM noise threshold effect, despite the increased noise resulting from this higher frequency. Such as increase in $\omega_m$ readily permits continuous scanning of the lobe and thus more accurate cross radial course navigation. Details of such scanning arrangements will be given in the following section on DF systems.

Application to DF Systems

In a DF system, i.e., with the inputs taken from points R and S in FIG. 2 and the aforesaid polar-diagram generating circuits located at the ground-station, the selection of a fixed radial course as with a beacon, is rarely, though occasionally, required. The main requirement is usually 360° coverage with the bearings of the targets shown on a rho-theta display, often with an additional digital presentation of the bearing. Thus the scanning requirement mentioned in relation to beacons becomes the main one in relation to DF systems.

FIG. 10 shows a scanning arrangement based on that of the FIG. 9 circuit 54. Previously (and subsequently) $\omega_m$ is shown for simplicity as generated separately in an oscillator 4 (FIG. 1) or 4' (FIG. 2). In practice $\omega_m$ is suitably generated by counting-down from a high-frequency crystal oscillator, e.g. by a factor of 1000, to give the desired frequency. The latter is produced as a square-wave, and the phase $\alpha$ of this square wave is defined in a know manner by the separation of the selected edges (spaced $2\pi/\omega_m$ apart) of the original high-frequency oscillation, from corresponding reference edges thereof, in the counting-down process. In FIG. 10 this square-wave of frequency $\omega_m$ and variable phase $\alpha$ is generated in a linear phase-modulator 48, and the phase $\alpha$ is controlled by a phase-modulator control circuit 49 which, for continuous scanning, varies the phase $\alpha$ cyclically through 360° at a frequency $\omega_y$. Suitably the control circuit 48 includes a microprocessor which allows the phase $\alpha$ to be specified by a digital number when continuous scanning is not required.

Suitable frequencies are 1000 Hz for $\omega_m$ (instead of 30 Hz as in FIG. 2) and 100 Hz for $\omega_x$ (instead of 5 Hz as previously). The frequency of $\omega_y$ may vary from zero (for a fixed manual setting) up to about 30 Hz, i.e. about $\frac{1}{3}$ of $\omega_x$. Control 49 allows a fixed setting, sector scanning or 360° scanning to be used. The advantage of using higher frequencies for $\omega_m$ and $\omega_x$ in continuous scanning has already been mentioned.

The variable-phase square-wave is fed to a low-pass filter 94 which rejects harmonics of $\omega_m$ and converts the square-wave to a sinusoid, and this $\omega_m$ output of variable phase replaces the $\omega_m$ phase-shifter 27 preceding point W in the FIG. 9 circuit 54. The lobe-null indication $J_1$ is detected as the output of filter 28' in FIG. 9. The arrangement as so far described constitutes a DF system allowing e.g. 360° scanning in which the $J_1$ polar diagram rotates continuously at up to 30 Hz. The polarity-sensing components in FIG. 9 are not important for DF, and hence components 40, 41, 42, 43 and 45 can be omitted, i.e., the $J_1$ circuit is simplified to that of FIG. 8. The bearings of targets are indicated by the advent of nulls as the polar diagram rotates.

Instead of the $J_1$-rotating system of FIG. 9, the twin $J_0$ lobe diagram of FIG. 7 can be rotated similarly, by substituting components 48 and 49 in FIG. 10 for phase-shifter 27 in FIG. 7, the two $J_0$ outputs being subtracted to give a continuously rotating null.

In FIG. 10 the rho-theta display is formed as follows. A reference-phase square-wave from modulator 48 is fed to a filter 95 similar to filter 94, and the sinusoidal outputs from these two filters are fed to conventional sinusoidal phase-detectors 96 which produce DC outputs proportional to $\cos \alpha$ and $\sin \alpha$. The $\theta$ aspect is obtained by feeding the latter, via respective multipliers (balanced modulators) 98 and 99, to respective similar multipliers 50 and 53 whose outputs are connected to the X and Y plates and thus produce a continuously rotating radial vector, with $\theta = \alpha$, in a conventional manner. The above $\cos \alpha$ and $\sin \alpha$ DC outputs are modulated between zero and their peak values in multipliers 98 and 99 by a ramp or triangular waveform produced in a generator 97, suitably at about 4 kHz, so that a full rotating vector appears on the screen rather than a single spot encircling its periphery. The rho amplitude is obtained by feeding the $J_0$ and $J_1$ outputs from circuit 54 to a level-detecting circuit 55, e.g., of the kind described in copending application Ser. No. 8722331, which detects the occurrence of the $J_1$ nulls, confirmed by the simultaneous $J_0$ peaks, as the polar diagram rotates. An output from circuit 55 generates a logic "1" in circuit 56 which opens a gate 57 for the $J_0$ output to be fed to the multipliers 50, 53. The length of the radial vector displayed at 51 thus corresponds to the amplitude of the $J_0$ output, and its position to the radiator bearing. The $\omega_m$ reference output of filter 95 is also used to operate the switches 6 and 6' in FIGS. 1 and 2.

The above arrangement is of the analogue type, but digital arrangements are also possible. For example, a digital display of bearing, to an accuracy determined by the aforesaid division ratio, e.g. 360°/1000, is obtained by feeding a variable-phase signal from control circuit 49 to a digital display 101, together with the output of gate 57 via a manually-adjusted logic-level generator 100. In order to avoid displaying the sidelobe responses (from which four small vectors are indicated in display 51), the threshold of generator 100 is adjusted so that an output is obtained, and bearing displayed, for the main lobe only. Signal amplitude is not displayed digitally. As an alternative to using gate 57 to define the digitally displayed vector; a conventional light-pen (or cursor) 102 connected to display 101 can be applied to the vector displayed on the screen of display 51. The digital display 101 normally includes a conventional store to allow continuous display of the bearing as the vector rotates.

As with existing rotable DF systems, using either mechanical or electrical rotation, the display will also show bearings from sidelobes. These will generally be much smaller than those from the mainlobe and can be rejected by observation or via the gate 57 which, on each scan, can be programmed to pass only $J_0$ outputs which are more than, say, 20% in amplitude of the previous scan's maximum amplitude. Alternatively, the ambiguity can be resolved by retaining also the limiter/discriminator arrangement of FIG. 2 to produce a rotating pseudo-synthetic aperture as aforesaid, in which the larger signal would capture the detection process. However, this alternative raises two points; firstly it will normally require the use of two receivers (as 15 and 16 in FIG. 2) whereas the present invention, as to be described, can use only one receiver. However, as described with reference to FIGS. 16 and 17, there is another factor which makes the use of two receivers preferred, viz an improved estimator method. Secondly, as already explained, the pseudo-synthetic technique produces its own difficulties at limiter threshold levels which it is an object of the present invention to overcome. Nevertheless, the additional retention of the pseudo-synthetic circuits to assist in resolving ambiguities may be useful in some cases.

In such cases it may be preferable to modify the present invention rather than use the prior arrangement of FIG. 2. This modification allows the largest signal to capture the processing without needing two receivers and consists in connecting an amplitude-limiter in front of the multiplier 25 as shown at 79 of FIG. 9. In FIG. 10 the $J_0$ and $J_1$ outputs then feed into gate 57 as already described, but the gate is set not to open for $J_0$ outputs less than (say by 10-20%) the maximum possible $J_0$ output obtainable from limiter 79. Thus outputs from the sidelobes in FIG. 5 do not reach the display. This modification suffers from the other errors, due to the limiter, present in the prior art. Hence either a separate additional correlator/estimator etc system is required or, preferably, the modifications are only switched into the FIG. 9 and FIG. 10 circuits when an ambiguity check is required.

Another way of resolving sidelobe ambiguity is shown in FIG. 10 by the additional interrupted-line circuitry therein, which shows a second processing channel connected to the output of filter 37. This is similar to the existing channel in the FIG. 9 circuit 54, as indicated by the primed numerals, except that the input to multiplier 38' from point W in FIG. 9 excludes the 90° phase-shifter 39. Also, a differentiator 80 follows filter 44', whose output operates a logic "1" generator 81. The latter's output is fed to an AND gate 82 which also receives the output of circuit 56.

The theory of operation is as follows. The input to multiplier 38' from phase-shifter 27 is now $\cos(\omega_m t - \theta_A + \alpha)$ instead of $\sin(\omega_m t - \theta_A + \alpha)$ as to multiplier 38. The output of filter 44' thus becomes $$J_1\left(2\Delta \sin \frac{\alpha}{2}\right) \sin \frac{\alpha}{2} \tag{18A}$$

which is no longer sense-resolved since, when $\alpha$ is near zero, (18A) becomes approximately $$\sin \frac{\alpha}{2} \cdot \sin \frac{\alpha}{2} = \sin^2 \alpha$$

which is always positive. This loss of resolution does not occur at any larger $\alpha$ angle since, as shown by the approximate plot of $$\sin \frac{\alpha}{2}$$

to the same scale in FIG. 5, at larger $\alpha$ angles the product represented by equation (18A) changes sign at the nulls between adjacent pairs of lobes. Thus a loss of sense-resolution at a null indicates that the $\alpha=0$ null is the one involved.

In FIG. 10 the differentiator 80 produces no output, i.e. the differential of (18A) tends to zero, when $\alpha$ is near zero, whereas when $\alpha$ departs from zero an output is obtained, i.e.

$$J_1\left(2\Delta \sin \frac{\alpha}{2}\right)$$

becomes finite. The absence of this output produces a "1" from generator 81 and thus opens gate 82 to any output from 56. The sidelobes are thus automatically suppressed. This arrangement does not suffer from errors produced by the limiter 79 but could be used, if desired, in combination with this limiter as described previously. As in FIG. 9, the additional circuitry in FIG. 10 is only switched in for a lobe-ambiguity check, the original circuit being used when left-right resolution is required.

Where the $J_1$ signal is obtained from a FIG. 8 circuit, rather than from a FIG. 9 circuit as in FIG. 10, there is no $J_0$ output to feed to gate 57 for the rho indication. In this case an output corresponding to the amplitude of the received signal can be obtained from e.g., point R, followed by linear detection.

Upon determination of a given radiator, the scanning can be stopped and monitoring of the communication content of the transmission, e.g., speech, therefrom commenced. An output for this purpose can be taken directly from the output of the multiplier 25 in FIG. 9. Alternatively, a further correlator/estimator arrangement, i.e., components 25, 26 (or 26'), 27 and 31 (with 26') alone, can be provided to allow monitoring of that radiator while scanning continues. Thus such monitoring facilities exclude the low-pass filter 28 which normally removes the $\omega_m, 2\omega_m, 4\omega_m$, etc terms from the cross-correlation which yields equation (7). This filter is not strictly necessary when on the bearing, since the zero-order term $$J_0\left(2\Delta \sin \frac{\alpha}{2}\right)$$

is then at or near unity whereas the $$J_2\left(2\Delta \sin \frac{\alpha}{2}\right)$$

and higher-order terms are near zero. Exclusion of the filter thus allows the higher modulation (communication) frequencies above $\omega_m$ to be passed on for monitoring without attenuation and/or distortion. It is an important advantage of the present invention, over the prior pseudo-synthetic system, that several lobe structures can be operated simultaneously with a single array. The limiter/discriminator in the prior system does not allow this because the processing is captured by the strongest signal. These several lobe structures can be fixed and/or scanning, over 360° or part thereof.

On occasion, an unwanted reflected signal, i.e., 30 in FIG. 3, will appear, having a greater amplitude than the wanted, non-reflected, signal. This could result in a bearing error which, though much less than in the prior pseudo-synthetic system, is still present. Often such a situation can be resolved manually by virtue of the more erratic nature of the unwanted display, e.g., it will tend to vary fairly rapidly in amplitude and bearing. Also, on occasion the unwanted signal will have a time-varying amplitude that permits the correct display of a wanted signal which is coincident with a sidelobe arising from reception of an unwanted signal, provided that the mainlobe due to the wanted signal is of greater amplitude than the sidelobe. Again manual observation can resolve the correct bearing. These abilities are further advantages of the present pure synthetic aperture system (which it shares with real aperture arrays) and result from the separate treatment of the individual signals rather than their effective combination, above the limiter threshold, in the prior pseudo system, where the limiter reduces all signals to the same amplitude.

Single-Receiver DF Systems

In the prior system of FIG. 2, the use of two receivers, 17 and 18, appears in practice to be essential. As already described, this system uses a frequency discriminator 22 to detect the bearing-imposed phase modulation. This phase modulation, re-expressed as frequency modulation, generally covers a narrow band which is equal to the tone frequency $\omega_m$ multiplied by the aperture $2\Delta$, e.g. in the region of 150 Hz to about 1000 Hz for $\omega_m = 30$ Hz.

In order to keep oscillator and thermal noise at levels below the FM threshold of the limiter 21/discriminator 22 combination, it is necessary to include the bandpass filter 20 of width comparable to the above band. This means that the mixing oscillator 18 must be close in frequency to the received signal frequency $\omega$, neglecting the phase (i.e., frequency) modulation of the latter due to scanning. However, lack of control, by the ground-station, over the transmission spectrum often means that there can be slow drifts and/or rapid frequency shifts outside the defined bandwidth, or even outside the beat frequency difference between signal and oscillator. In order to overcome this effect it would be necessary to increase bandwidth and beat frequency, but this would produce the undesirable noise threshold effect mentioned above. Even very rapid shifts within the beat frequency difference can add to the thermal noise and so further degrade the FM threshold performance. All these difficulties are resolved by the use of the second receiver 15 connected to the single central aerial 1', whose output combines with that of receiver 16' in mixer 19 to cancel the unwanted phase modulations. However, this solution involves the extra complexity and expense that two virtually identical receivers are needed which must be similarly tracked/tuned as regards the phase-frequency dispersion characteristics of their RF/IF selection circuits.

The present invention can provide a DF system having only one receiver without the above difficulties, although as mentioned earlier, two receivers (one of which can be of relatively simple form) are preferred for another reason. As indicated by the interrupted-line portion of FIG. 2, the input to the circuit of FIG. 9 is taken from the output of receiver 16. The aerial 1', receiver 15, local oscillator 17 and mixer 19 are omitted, also the 10 kHz difference frequency of local oscillator 18. This single-receiver system does not suffer from the above difficulties because:

(1) the outputs from filters 28/28' do not suffer from the classic FM threshold effect since their noise levels are determined by the filter bandwidths provided the signal-to-noise ratio is above the amplitude-modulation (AM) detection threshold of the multiplier 25;

(2) following from (1), multiplier 25 in FIG. 9 acts as a phase detector which, by virtue of filters 28 and 37, will only produce noise within small bandwidths around the carrier and sidebands of the estimated signal spectrum. These bandwidths are directly related to the DF information bandwidth, i.e., the rate at which bearings can change, and so can be very small.

It will thus be seen that two receivers are not required until a point is reached where the unwanted incidental or noise-modulated signal spectrum, i.e., the bandwidth of the received signal apart from components due to changes in radiator bearing, is greater than the spectrum of the rotational ($\omega_m$) sidebands over the information bandwidth as defined in (2) above. Such a situation will be so unusual that a single receiver will normally suffice. However, two receivers can be employed as described, i.e., taking the signal input from R in FIG. 2, if such noise may be of sufficient level to cause problems.

The above single-receiver DF system has a disadvantage over the prior FIG. 2 system in that it may not provide good monitoring facilities when the DF system is in the scanning mode; in FIG. 2 continuous monitoring is obtainable via receiver 15 connected to aerial 1'. (Also, as mentioned, a single receiver doews not allow use of the preferred estimator method of FIGS. 16 and 17.) If the scanning is very rapid compared with the radiator's signal modulation this will not be a problem, but otherwise the signal will be unduly chopped up. At slower scanning speeds a separate receiver purely for monitoring can be used. It need not be as complex as the receiver 15 in FIG. 2 and can be located, with its aerial, well away from the DF array, so reducing its site-error producing capability.

The Estimator

FIG. 11 shows the basic circuit of the estimator 26 in FIG. 4. It comprises a multiplicative mixer 58, similar in form to the previous multiplier 25, which beats the incoming signal ω from P (FIG. 1) or R (FIG. 2) with that produced by a voltage-controlled oscillator (VCO) 59. The VCO is frequency-modulated by the reference tone $\omega_m$, either from phase-shifter 27 alone as shown, or from the alternative phase-shifting arrangements already described, i.e., including phase-shifters 32 and 33 in FIG. 7 and modulator 48 in FIG. 10. The output of mixer 58 is fed to a low-pass filter 60 which removes the $\omega_m$-based signals and its DC output is fed back to VCO 59. The resulting VCO output is the aforementioned estimated signal fed to multiplier 25 in earlier Figures; it is frequency-locked to, and has a fixed phase relationship with, the incoming signal. This phase relationship depends on the initial frequency difference between the VCO output with zero applied voltage, and the incoming signal.

FIG. 11 constitutes a phase-lock loop but has the disadvantage that the VCO output phase may not always be that required. Such a required phase is obtainable from the phase-corrected loop shown in FIG. 4 of copending application Ser. No. 8705428 (Publication No. GB 2,187,907A), but both of these circuits have the further disadvantage that they could lock on to the phase of a strong unwanted reflected signal, thus producing errors in the bearing determination.

Another difficulty with the FIG. 11 circuit is that it cannot function at certain values of α, the phase-difference of $\omega_m$ between the received and estimated signals. The reason for this resides in the structure of the zero-order Bessel Function $$J_o\left(2\Delta \sin \frac{\alpha}{2}\right)$$

which is a factor in the output of filter 60 and which does not subsequently produce a DC output at certain values of α. One way of overcoming this problem is to form the estimation in two stages, i.e., to use two FIG. 11 circuits in series, the second fed by the VCO output of the first stage. The first stage is fed by $\omega_m$ phase-shifted by a favourable amount $\alpha_1$ and the second stage by $\omega_m$ phase-shifted by a favourable amount $\alpha_2$ such that $\alpha_1 + \alpha_2 = \alpha$. However, one way of overcoming the problem will be described with reference to FIGS. 12 and 13. (A preferred way is described with reference to FIGS. 16 and 17.)

FIG. 12 shows an estimator which incorporates the already described phase-cycling method of overcoming the phase-locking problem between the carriers ω of the received and estimated signals shown in FIG. 6, i.e., the introduction of $\omega_x$ from oscillator 31. FIG. 12 receives similar inputs to FIG. 11, but the output of multiplier 58 is fed via a low-pass filter 61 to a second multiplier (modulator) 62 which receives the $\omega_x$ input from oscillator 31. Filter 61 passes frequencies up to $\omega_x$ and rejects $\omega_m$. The output of multiplier 62 is fed to a filter 60 to eliminate $\omega_x$ and thence to VCO 59. The nett output from multiplier 58 is a signal of frequency $\omega_x$ and of amplitude proportional to the zero-order Bessel Function as already discussed. This signal is selected by filter 61 and multiplied in multiplier 62 by the $\omega_x$ input from oscillator 31. The nett effect, when the output of multiplier 62 is fed back to VCO 59 via filter 60, is frequency locking of the $\omega_m$-modulated VCO output to the received signal at a frequency which differs from that of the received signal by $\omega_x$, i.e. ω has received an increment $\omega_x$. This arrangement suffers from null zeroes, defined by the zero-order Bessel Function as described with reference to FIG. 11, but in this case the effect can be overcome by the modifications shown in FIG. 13.

The method of FIG. 13 is based upon derivation of a first-order Bessel Function in a similar manner to FIG. 9. It will be seen from FIG. 5 that nulls from the $J_0$ and $J_1$ functions never coincide with one another at a given α, and FIG. 13 exploits this fact. As in FIG. 11, a $J_0$ output at $\omega_x$ is obtained from filter 61 and is squared in squarer 63 which is followed by a filter 64 passing $2\omega_x$ and below. A $J_1$ output at $\omega_m$ is selected by filter 37 as in FIG. 8, and is squared in squarer 65 which is followed by a filter 66 passing $2\omega_x$ and below, whose output is fed via a 90° phase-shifter 67 to an adder 68. Adder 68 also receives the $J_0$ signal from filter 64 and the $J_0 + J_1$ signal is passed to the correlator 62 which here receives an input of $2\omega_x$ from oscillator 31' (not $\omega_x$ as in FIG. 12). The output of multiplier 62 is filtered of $2\omega_x$ components by filter 60' whose DC output is fed back to control the VCO.

The theory of operation of FIG. 13 is as follows. Let the phase-shifter $\omega_m$ input to VCO 59 be at some angle $\alpha_r$. Then the outputs from filters 61 and 37 respectively will be (cf equation 15)):

$$J_0 = \cos(\omega_x t + \phi) J_0\left(2\Delta \sin \frac{\alpha_r}{2}\right) \quad (19)$$

$$J_1 = \sin(\omega_x t + \phi) J_1\left(2\Delta \sin \frac{\alpha_r}{2}\right) \sin\left(\omega_m t - \theta_A + \frac{\alpha_r}{2}\right) \quad (20)$$

After squaring, filtering and (with $J_1$) phase-shifting these outputs as shown, they become proportional to $$J_0 \text{ output} = J_0^2\left(2\Delta \sin \frac{\alpha_r}{2}\right)\cos(2\omega_x t + 2\phi) \quad (21)$$

$$J_1 \text{ output} = \frac{1}{2} J_1^2\left(2\Delta \sin \frac{\alpha_r}{2}\right)\sin(2\omega_x t + 2\phi) \quad (22)$$

After attenuating the $J_0$ output by a factor 2 to simplify the mathematics (though this need not be done in practice), the sum of (21) and (22) can be written as $$X \cos(2\omega_x t + \phi + Y) \quad (23)$$

$$\text{where } X = \sqrt{J_0^4\left(2\Delta \sin \frac{\alpha_r}{2}\right) + J_1^4\left(2\Delta \sin \frac{\alpha_r}{2}\right)} \quad (24)$$

$$\text{and } Y = \tan^{-1}\left\{\frac{J_1^2\left(2\Delta \sin \frac{\alpha_r}{2}\right)}{J_0^2\left(2\Delta \sin \frac{\alpha_r}{2}\right)}\right\}$$

Since X in equation (23) contains both $J_0$ and $J_1$ terms (see equation (24)) and these are never simultaneously zero regardless of the value of $\alpha_r$, X can never be zero and correlation of equation (23) with cos $2\omega_x t$ by multiplier 62 and filter 60 will always produce a DC term proportional to cos $(\phi+Y)$. This DC term controls the VCO 59 in the usual manner of a phase-lock loop to impose the frequency difference of $\omega_x$ between the estimated and received signals.

Alternative Estimator Method

The basic estimator shown in FIG. 11 stems from the premise that the carrier $\omega$ of the estimated signal must be phase-locked with that of the received signal. The phase-cycling produced by the addition of $\omega_x$ effectively breaks this premise in that exact phase-locking is not necessary. It might be though that the value of $\omega_x$ need not be precisely defined as in FIGS. 12 and 13, but could be allowed to assume some random value dependent on the free-running frequencies of the received signal and the VCO output. It is necessary, however, to keep $\omega_x$ within a defined range so that subsequent filters related to $\omega_x$ can be designed to reasonable criteria.

If the frequency stability of the received carrier is sufficiently good, e.g., as may be the case with a DF system for cooperating aircraft having stable transmitters, it is possible to use an estimator which is independent of the received carrier, thereby avoiding potential problems due to large amplitude variations of the received signal. This can be done, in modifications of FIGS. 12 and 13, by substituting for the signal received from P or R the output of a stable oscillator 69 having substantially the same frequency, $\omega$, as the received signal. The phase-cycling frequency, $\omega_x$, is injected into these circuits as already described. Unlike the received signal, this oscillator output has no $\omega_m$ phase modulation upon it. The VCO 59 retains its phase-modulating $\omega_m$ input from circuit 27 and produces an "estimated output" (for correlation with the received signal as in FIGS. 4 and 6-9) which has the frequency of the stable oscillator plus $\omega_x$.

As applied to the estimator of FIG. 13 the theory is similar to that already given. However, because of the absence of $\omega_m$ phase modulation in the stable oscillator output, equations (21) and (22) are modified in that $$2\Delta \sin \frac{\alpha_r}{2}$$

is replaced by $2\Delta$. The vertorial addition principle, as illustrated by the derivation of X and Y, remains the same; in this case X can never be zero regardless of the value of $\Delta$. Hence there is again always a $2\omega_x$ input from adder 68 for correlation with the $2\omega_x$ output from oscillator 31', and frequency-locking of the VCO, including the addition of $\omega_x$, takes place as before.

It will be understood that the illustrated circuits are largely diagrammatic for purposes of explanation, and that in practice some of the components shown separately can be combined. For example the multiplier 58 shown in FIGS. 11-13 can be common with the multiplier 25 shown in FIGS. 4 and 6-9.

Alternative, Synchronous, Method of Correlation

FIG. 14 illustrates an alternative, though non-preferred, method of correlating the estimated carrier and the received carrier, instead of the phase-cycling method already described, i.e., the addition of $\omega_x$. Unlike the latter, the method of FIG. 14 is a synchronous one which utilises a quadrature version of the estimated signal. The output of an estimator 70 similar to that of FIG. 11 is fed to two correlating multiplier/filters 71/28, 72/28, in the latter case via a 90° phase-shifter 73. Both multipliers are fed with the received signal as shown, and their outputs pass via low-pass filters 28 (as e.g., in FIG. 4) to respective squarers 74, 75. The squared outputs are added in adder 76 and the square-root of their sum obtained from square-root circuit 77 for display as $J_0$ in display 78. Circuit 77 can be of the kind described in our copending application Ser. No. 8623236.

The theory is as follows:

Following from equation (6), the 90° phase-shifted estimated signal fed to multiplier 72 is $$\cos(\omega t + \phi + \Delta \cos(\omega_m t - \theta_A + \alpha)) \tag{25}$$

This signal is used in a similar manner to that expressed by equation (6) fed to multiplier 71, so that two other versions of equations (7) and (8) are obtained, viz $$\sin \phi \, J_o\left(2\Delta \sin \frac{\alpha}{2}\right) \tag{26}$$

and $$k\sin(\phi - \phi_k) J_o\left(2\Delta \sin\left(\frac{\alpha - (\theta_A - \theta_k)}{2}\right)\right) \tag{27}$$

Both pairs of terms are squared in the respective squarers 74, 75, and the square-root of their sum becomes (replacing the $J_0$ terms by $J_0$ and $J_{0k}$ in (26) and (27) respectively for convenience), $$\sqrt{\{(7)+(8)\}^2 + \{(26)+(27)\}^2} = \tag{28}$$

$$\sqrt{\begin{array}{c}(J_o\cos\phi + kJ_{ok}\cos(\phi-\phi_k))^2 + \\ (J_o\sin\phi + kJ_{ok}\sin(\phi-\phi_k))^2\end{array}} =$$

$$\sqrt{J_o^2 + 2kJ_oJ_{ok}\cos\phi_k + k^2J_{ok}^2} \approx J_o + J_{ok}\cos\phi_k$$

when k is small.

Equation (28) is identical with equation (9) if the J terms are replaced by P etc, i.e., the performance of the synthetic aperture system has been upgraded to that of a real aperture system using linear detection.

A $J_1$ output can be obtained from FIG. 14 by inserting bandpass filters and linear detectors similar to components 37 and 32' respectively as in FIG. 8, together with two of the noise-reduction arrangements therein if required. In addition, an estimator based on the principle of FIG. 13 can be obtained by taking $J_0$ and $J_1$ outputs from respective Figure 14-type circuits, adding them, and using their sum to control the VCO 59 directly, i.e. omitting components 60' 62 and 31' in FIG. 13.

The FIG. 14 arrangement, and its $J_1$ and estimator derivatives, are not preferred because, although simpler, they require perfect squarer and square-root circuits which may not be readily achievable over a given dynamic range, particularly if adequate AGC arrangements cannot be used.

Linear Arrays

The invention has so far been described in relation to the use of scanned circular arrays, but circularity is not essential. The invention can also use e.g. a scanned linear array in which a line of equispaced aerials in scanned sinusoidally with the maximum scan-rate at the centre of the array. Such arrays can be used for DF and are also suitable for some forms of beacon, e.g. microwave landing aids in which a defined approach path near to, or at, the normal to the array is required. The centre aerial can also continuously transmit the reference tone $\omega_m$, corresponding in function to aerial 1 in FIG. 1, or a separate aerial can be used for this purpose.

For such an array, the received RF phase at any aerial, relative to that at the centre of the array, at any instant t, can be expressed as $$\Delta_1 \sin \theta_A$$

where $\Delta_1$ is the distance of the activated aerial from the centre and $\theta_A$ is the bearing of the signal relative to the normal to the array.

For sinusoidal scanning $$\Delta_1 = \Delta \sin \omega_m t$$

where $\Delta$ is half the array length (i.e. aperture=$2\Delta$) e.g. at times $t=0$, $\pi/\omega_m$, $2\pi/\omega_m$ etc the activated aerial is the centre one.

Thus the overall reception can be expressed in fairly similar terms to equation (1) for the circular array, viz $$\sin(\omega t + \Delta \sin \theta_A \sin \omega_m t) \tag{29}$$

If now an estimated signal $$\sin(\omega t + \phi + \Delta \sin(\theta_A + \alpha) \sin \omega_m t) \tag{30}$$

is generated (compare equation (6) for the circular case, in which the modulation phase of $\omega t$ is controlled by changing the phase of the $\omega_m t$ term rather than the amplitude of the $\omega_m t$ term as in equation (30)) then after cross-correlation of signals (29) and (30), the product includes a DC time-invariant term (compare equation (4)):

$$J_o\left(2\Delta \sin \frac{\alpha}{2} \cos\left(\theta_A + \frac{\alpha}{2}\right)\right) \tag{31}$$

plus higher order time-variant Bessel terms containing $\omega_m$, $2\omega_m$, etc as before. This assumes that the effect of $\phi$ is eliminated as in FIG. 14, or averaged-out via $\omega_x$ as before, otherwise (31) is multiplied by $\cos \phi$ as in equation (7).

For signals in the broadside (normal) direction, i.e. $\theta_A = 0$ and $\alpha$ tending to zero, the output becomes approximately $$J_o\left(2\Delta \sin \frac{\alpha}{2}\right) \tag{32}$$

as for the circular array (equation (4)).

As before, equation (32) represents a mainlobe/sidelobe polar diagram which, as $\alpha$ is varied, has a maximum mainlobe value when $\alpha=0$.

So far the arrangement has similarities with the circular array and, like it, if $(\theta_a + \alpha)$ is treated as a complete variable the main lobe can be rotated or scanned, here by changing the amplitude term of $\omega_m$, i.e. $(\theta_A + \alpha)$ in $\sin(\theta_A + \alpha)$, as already mentioned in relation to equation (30). In particular the broadside polar diagram can be scanned about its nominal position by varying $\alpha$. In the circular case, however, the overall pattern was not dependent on $\theta_A$ as there was circular symmetry. In the linear case the pattern is dependent on $\theta_A$. For example in the region of signals at $\theta_A = \pm 90°$, equation (31) becomes approximately $$J_o\left(2\Delta \sin^2 \frac{\alpha}{2}\right) \tag{33}$$

This produces a broader mainlobe than equation (32) and in effect corresponds to a typical "endfire" polar diagram. By changing $(\theta_A + \alpha)$ between $\pm 90°$, the polar diagram can be scanned between the two endfire directions, passing broadside at $(\theta_A + \alpha) = 0$.

As with the circular array, lobe nulls can be derived, as in FIG. 8, by using a bandpass filter 37 centred on $\omega_m$ to select the first-order Bessel Function $J_1$ from the multiplier 25, and varying $(\theta_A + \alpha)$ to obtain, via $\Delta \sin(\theta_A + \alpha)$, zero output at the radiator bearing.

The modifications to the described circuits, for use with linear arrays, are as follows:

In FIGS. 4, 6, 8, 9, 11, 12 and 13, the phase-shifter 27 is replaced by an amplitude controller.

In FIG. 7, phase-shifters 27, 32 and 33 are replaced by amplitude controllers.

In FIG. 10, phase-modulator 48 is replaced by an amplitude controller operated by $\omega_y$.

Reduction of Sidelobe Levels with Linear Arrays

It can be shown that the $\omega_m$ term connected with the first-order, $J_1$, Bessel Function, as well as corresponding terms connected with higher-order Functions, are independent of $\theta_A$ and $\alpha/2$, as distinct from the circular-array case as typified by equation (15). This fact allows scalar (i.e. amplitude-only) addition, rather than vectorial addition, of all the components compiled from individual reflections; in the circular case this only applies to the zero-order term $J_0$. This scalar addition allows the sidelobe levels in the linear case to be altered in a predictable way by a suitably weighted addition of selected even-order Bessel Functions to a zero-order Function.

The theory of this method is based upon the mathematical expansion of expressions of the type $$\frac{J_r(X)}{X^r} \tag{34}$$

For $r=0$, equation (34) becomes $$J_0(X) \tag{35}$$

i.e. the zero-order term with its mainlobe and sidelobe as already described.

For $r=1$, $$\frac{J_1(X)}{X} = \tfrac{1}{2}[J_0(X) + J_2(X)] \tag{36}$$

i.e. the addition of a second-order term to the zero-order term, no weighting being involved. (The fraction $\frac{1}{4}$, outside the bracket, is effectively a gain term, of no significance.)

Equation (36), gives a much-reduced sidelobe level as is shown by FIG. 15, which plots the summed amplitude against X, though at the cost of increased mainlobe width. (FIG. 15 is symmetrical about the broadside direction, so only half the polar diagram is shown. Also in FIG. 15 X is a number and not the value of $\alpha$ as in FIG. 5.)

For r=2

$$\frac{J_2(X)}{X^2} = \frac{1}{8}[J_0(X) + 1\frac{1}{2}J_2(X) + \frac{1}{2}J_4(X)] \quad (37)$$

where the weighting factors are respectively $1\frac{1}{2}$ and $\frac{1}{2}$. Equation (37) gives a further reduced sidelobe level not shown in FIG. 15.

For r=3, $$\frac{J_3(X)}{X^3} = \frac{1}{48}[J_0(X) + 1.5J_2(X) + 0.6J_4(X) + 0.1J_6(X)] \quad (38)$$

where the weighting factors are respectively 1.5, 0.6 and 0.1. The still further reduced sidelobe levels for r=3 are shown in FIG. 15; and so on for higher values for r. In practice the improvement obtained via equation (36) will usually suffice.

It is also possible to achieve virtual sin X/X performance from a linear array as the following theory shows.

Let two polar diagrams $J_0$ and $J_2$ be generated as follows:

$$J_0(X) + qJ_2(X) \quad (39)$$

where X is the general common argument of the functions and q is a weighting factor.

These terms can be expanded thus:

$J_0(X) + qJ_2(X) =$ $1 - \frac{X^2}{4}\left[1 - \frac{q}{2}\right] +$ higher-order terms of small value.

But sin X/X can be expanded thus:

$$\frac{\sin X}{X} = 1 - \frac{X^2}{6} + \text{higher-order terms of small value}$$

For equality of the second-order terms, $q=\frac{2}{3}$.

Thus a synthetic linear-aperture polar-diagram using the above value of q in equation (39) will approximate to the well known sin X/X window function.

The above methods improve the performance of a linear array in a microwave landing system, in that errors due to local reflections occurring well away from the defined aproach path will be much reduced.

Circuits for implementing the above methods can be obtained by suitable modifications of FIG. 8. As previously described, FIG. 8 selects the $J_1$ Bessel Function associated with $\omega_m$, but in principle this type of circuit can select any order of Function by appropriate choice of frequency for filter 37 and phase-shifter 39, and of input frequency to the latter; the latter is produced by connecting a harmonic generator 83 where shown for orders above the first-order. Thus:

For $J_2$: filter 37 passes $2\omega_m \pm 0.2\omega_m$, phase-shifter 39 operates at $2\omega_m$ and generator 83 produces $2\omega_m$;

For $J_4$: filter 37 passes $4\omega_m \pm 0.4\omega_m$, phase-shifter 39 operates at $4\omega_m$ and generator 83 produces $4\omega_m$;

and correspondingly for $J_6$.

To produce equation (36) a $J_0$ output from a FIG. 6 circuit and a $J_2$ output from a thus-modified FIG. 8 circuit, after suitable amplification or attenuation (not shown) as necessary to satisfy the equation, are added together as shown at 84 in FIG. 8 and their sum fed to a common display such as 29 or 29'. To produce equation (37) or (38), additional Figure 8-type circuits are used to obtain $J_4$ and $J_6$ outputs which, suitably amplified or attenuated, are fed similarly to adder 84. Equation (39) can be produced similarly.

Where the noise-reducing arrangements of FIG. 8 are not inlcuded, i.e. component 39 being omitted and 38 becoming a linear detector as described earlier, separate complete FIG. 8 circuits for each Function $J_2$, $J_4$ etc are not needed. Instead, the respective filters 37 can be connected to a single multiplier 25 and their outputs, via separate detectors 38, filters 28' and detectors 32', and after suitable amplification or attenuation, fed to the adder 84.

Linear Elevational Arrays

Such linear arrays can also be used to provide elevational information, e.g. in a microwave landing system, by mounting the array vertically instead of horizontally. However in this case there will also be an image of the array reflected in the ground, and the scan direction in the image array will be opposite to that in the actual array. When correlated with the estimated signal in the manner of the present invention, the image polar diagram will therefore point downwards to earth rather than upwards to the sky as would the polar diagram of the actual array in the absence of the image array. This is identical to the situation with a real-aperture array, and again indicates the equivalence thereto of the present synthetic-aperture arrangement.

General Applications of Selected Bessel Functions

The use of even-order Bessel Functions $J_0$, $J_2$, $J_4$ etc is not necessarily restricted to improving the sidelobe performance, as described above; thus a particular polar diagram can be produced by other selected and weighted combinations of even-order Functions. Furthermore, the odd-order Functions $J_1$, $J_3$ etc can also be used, in conjunction with even functions if desired, for the latter purpose. Additionally, the higher-order Functions $J_2$, $J_3$, $J_4$ etc all have zeros at the lobe-maximum of the zero-order Function $J_0$. Thus in principle any of these higher-order Functions may be used individually for lobe-null determination (in either circular or linear arrays) as described for the $J_1$ Function. However, their use is not preferred, as the rate of change of amplitude about their nulls is less rapid than for the $J_1$ Function.

Preferred Alternative Estimator Method

The methods of generating the "estimated" signal described with reference to FIGS. 11, 12 and 13 are satisfactory for use when the received signals have a strong carrier or sub-carrier content. This applies to aircraft beacons, but there may be direction-finding requirements where there is no such content, e.g. where the received signals are single-sideband or PSK signals for example. In such cases the phase-lock loop circuits constituted by FIGS. 11-13 will not function properly. The method now to be described overcomes this disadvantage and is also applicable where a strong carrier or sub-carrier is present, i.e. its flexibility allows its use in both beacons and DF. Moreover it can produce phase-locking of the received and estimated signals for any value of the phase difference between the $\omega_m$ modulation of the two signals.

In FIG. 16 the circuit 79 within the interrupted-line box is a known form of single-sideband generator (or convertor) circuit, of the quadrature phase-shift type. It comprises an input connection for one signal to a first multiplier 80 and, via a 90° phase-shifter 81, to a second multiplier 82. The multiplier outputs are summed (in this example; they may be subtracted in others) in an adder 83. A second input connection to the respective multipliers, for a second signal, goes to 82 directly and to 80 via a 90° phase-shifter 84. The output from the adder 83 is the upper (or lower) of the mixed product of the two signals. In a known use of this generator, one input is, say, an audio signal and the second input a radio-frequency (RF) signal. The output is then an upper (or lower as appropriate) single-sideband signal at the RF frequency which, after amplification and/or upward frequency conversion, can be used for single-sideband transmission.

In the present application of circuit 79, taking the DF case, the input is obtained e.g. from the omnidirectional reference aerial 1' in FIG. 2, via a suitable receiver, i.e. it must be a signal unmodulated in phase by the bearing direction, unlike the received-signal inputs in FIGS. 11-13. Let this signal be of the form $$E_u \sin \omega_u t$$

where $E_u$ and $\omega_u$ can contain respectively any amplitude or frequency modulation present in the signal, other than modulation by the bearing direction.

The second input to the circuit 79 is obtained from a voltage-controlled oscillator (VCO) 85 of basic angular frequency $\omega_x$, where $\omega_x$ is the phase-cycling increment obtained from oscillator 31 (FIG. 6). The VCO 85 is modulated by the frequency $\omega_m$, (the synthetic-aperture scanning frequency), either phase-modulated in the case of a circular array or amplitude-modulated in the case of a linear array, as explained earlier. This modulation is controlled by the circuit 27 in FIG. 6 as before.

The second input to circuit 79 is thus a two-part signal, $\omega_v$, of the form $$\omega_v = \omega_x + (\omega_x \text{ modulated by } \omega_m, \text{ ie the sidebands of } \omega_x)$$

The output from output 83 is thus of the form $$E_u \sin (\omega_u + \omega_v)t$$

which is fed to the multiplier 25 in FIG. 6 as the estimated output together, as before, with the input signal from the circular array which, using the terminology of equation (1), is of the form $$E_u \sin (\omega_u t + \Delta \cos (\omega_m t - \theta_A))$$

The selected Bessel Function is then derived as described earlier. Thus FIG. 16 in total corresponds to FIG. 6 preceding filter 28, providing an alternative estimator-signal generating arrangement; FIGS. 8 and 9 can be modified similarly.

The value of $\omega_x$ given earlier by way of example was low, 5 Hz. It was explained that $\omega_x$ should be either much less than $\omega_m$ or much greater than $\omega_m$, and the present estimator arrangement is well suited to such higher values. Where $\omega_x$ is low, the frequency-modulation of VCO 85 may raise design difficulties because the deviation will take the instantaneous frequency each side of the nominal centre frequency ($\omega_x$) of the VCO output. FIG. 17 showed an arrangement which overcomes this potential difficulty. In FIG. 17 the VCO 85 of FIG. 16 is replaced by a VCO 86 of nominal centre frequency $\omega_1 + \omega_x$, where $\omega_1 > > \omega_x$, and receives the modulating input $\omega_m$ from circuit 27 as in FIG. 16. The output of VCO 85 is thus $\omega_1 + \omega_v$, which is combined in a multiplier 88 with the output of a fixed oscillator 87 of frequency $\omega_1$. The multiplier output is thus a two-part signal, one part of frequency $(2\omega_1 + \omega_v)$ and the other of frequency $\omega_v$; the bracketed part is removed by a low-pass filter 89 leaving the signal $\omega_v$ to be fed to circuit 79 in FIG. 16 as before. This arrangement has the advantage that it is easier to frequency-modulate the relatively high frequency $\omega_1 + \omega_x$ than the low frequency $\omega_x$, by the signal $\omega_m$.

The arrangement of FIG. 17 as so far described may still present a difficulty in the design of the 90° phase-shifter 84, if $\omega_x$ is small and the frequency excursion of $\omega_v$ us relatively large. This difficulty can be overcome by the modifications shown by the interrupted lines in FIG. 17 and circuit 79. The output of oscillators 86 and 87 are also fed to a second multiplier 90, in the case of oscillator 87 via a 90° phase-shifter 91 (operating at the relatively high frequency of $\omega_1$). This multiplier output is filtered in a filter 92 similar to filter 89 to give an output $\omega_v$ similar to that of filter 89 but 90° displaced in phase. The two filter outputs, A and B, are fed directly to the multipliers 80 and 82 in circuit 79 as shown, from which phase-shifter 84 is now omitted.

If required, e.g. to facilitate the design of subsequent filters, the difference frequency $\omega_x$ between the frequencies of oscillators 86 and 87 can be defined and stabilised more closely by an arrangement similar to FIG. 13. In this arrangement the VCOs 86 and 87 of FIG. 17 become the VCO's 59 and 69 respectively of FIG. 13. The fixed and modulated inputs to the multiplier 88 in FIG. 17 can then be obtained from oscillator 69 and VCO 59 respectively. However, it will be seen that this involves unnecessary duplication of the multipliers and subsequent low-pass filters, and the eventual $\omega_v$ output A can instead be taken from the output of filter 61. The $\omega_v$ output B can be obtained as before, i.e. by feeding outputs from oscillators 69 and 59 of FIG. 13 into units 90 and 91 of FIG. 17.

The original purpose of the FIG. 13 circuit, as explained earlier, was to allow phase-locking of the received and estimated signals for any value between 0° and 360° of the phase difference between the $\omega_m$ modulation of the two signals. This arrangement is satisfactory but somewhat complex. The arrangements of FIGS. 16 and 17, which are similar, produce an estimated output which can likewise produce phase-locking for any value of $\omega_m$ phase-difference, and can thus advantageously replace the FIG. 13 arrangement in either beacon or DF applications, provided they produce an acceptable value and stability of $\omega_x$ without recourse to the incorporation of a FIG. 13 arrangement or arrangements as described in the immediately preceding paragraph.

The arrangements of FIGS. 16 and 17 require the use of a separate omnidirectional reference aerial element and hence of two receivers, whereas an advantage of the DF system as described earlier was the need for a single receiver only. However, it was also remarked that an additional receiver, of simple form, and connected to such an aerial element, would be required to provide good signal-content monitoring during the DF scanning mode. Such a receiver would also be satisfactory for the purpose of FIGS. 16 and 17.

The present invention need not use the particular form of single-sideband generator or convertor shown in FIG. 16. Other such circuits providing the same function can be substituted.

I claim:

1. A method of processing signals received from one of a synthetic-aperture aerial from an external radiator and a synthetic-aperture aerial at an external position, which is phase-modulated at the scanning frequency of said aerial, comprising:

generating a signal of the same carrier frequency as the received signal and phase-modulated at the scanning frequency;

multiplying the generated signal by the received signal to derive an output which includes a selectable Bessel Function representing a directional polar diagram;

and controlling one of the phase and amplitude, based upon the aerial configuration, of the scanning frequency, as applied to produce said phase-modulation of the generated signal, in order to maximise or minimise, as appropriate, a selected Bessel Function and thereby control the bearing direction of said polar diagram relative to the aerial.

2. A method as claimed in claim 1 wherein the generated carrier is shifted by an increment in order to average-out phase differences between the received and generated carriers.

3. A method as claimed in claim 1 wherein the component of the multiplied output unmodulated by the scanning frequency is selected, consituting a zero-order bassel Function whose maximum value represents a polar diagram having its main lobe in the bearing direction.

4. A method as claimed in claim 1 wherein the component of the multiplied output modulated by the scanning frequency or a harmonic thereof is selected, constituting a first-order or higher-order Bessel Function whose minimum value represents a polar diagram having a null in the bearing direction.

5. A method as claimed in claim 3 wherein two fixed scanning-frequency phase-shifts or amplitude-shifts are each added to said controlling phase of the scanning-frequency in opposite senses, and the two summed phases are applied to phase-modulate or amplitude-modulate the carriers of two generated signals which are separately multiplied by the received signal to derive outputs constituting two zero-order Bessel Functions whose maximum values represent a polar diagram having two overlapping main lobes which are symmetrical about the bearing direction.

6. A method as claimed in claim 4 wherein said selected first-order or higher-order component is multiplied by a 90° phase-shifted version of the controlling phase of the scanning frequency or a harmonic thereof in order to derive an output having reduced noise.

7. A method as claimed in claim 4, wherein the first-order Bessel Function amplitude-modulating said averaging-out increment is detected in effectively a synchronous manner with respect to a 90° phase-shifted version of a zero-order Bessel Function amplitude-modulating said averaging-out increment to provide an output whose polarity defines on which side of the null the instantaneous direction of the received signal lies.

8. A method as claimed in claim 7 wherein the zero-order Bessel Function amplitude-modulating said averaging-out increment is normalised prior to said detection in order to obtain a relatively constant amplitude.

9. A method of processing the signal transmitted from the synthetic-aperture aerial of a radio-beacon and received by an aircraft, comprising a method as claimed in claim 1 wherein the operator in the aircraft adjusts the phase or amplitude of the scanning frequency as applied to produce said phase-modulation of the generated signal in order to determine the bearing to the beacon as the phase, relative to a reference phase, required to obtain a Bessel Function output or outputs representing the bearing to the beacon.

10. A method as claimed in claim 9 wherein said method is used additionally to a method in which the signal from the synthetic-aperture aerial is processed by means including an amplitude-limiter and, optionally, a frequency-discriminator.

11. A method as claimed in claim 9 wherein the aerial comprises a circular array of scanned omni-directional elements and a single continuously transmitting omni-directional reference element, and the phase of the scanning frequency is controlled.

12. A method as claimed in claim 9 wherein the aerial comprises a linear array of sinusoidally scanned omni-directional elements and a single continuously transmitting reference element, and the amplitude of the scanning frequency is controlled.

13. A method of determining the bearing of a signal or signals received by a synthetic aperture aerial from a radiator or radiators comprising a method as claimed in claim 1 wherein the phase or amplitude of the scanning frequency as applied to produce said phase-modulation of the generated signal is continuously varied at a low frequency to scan the polar diagram over an arc of interest and the bearing of the received signal or signals is indicated by their temporal position relative to the phase or amplitude of said low-frequency scan.

14. A method as claimed in claim 1 wherein said generated signal is produced by feeding the carrier-frequency signal received from the synthetic-aperture aerial to a first multiplier connected in a phase-lock loop including a first low-pass filter and a voltage-controlled oscillator, said oscillator also receiving as a control voltage the scanning frequency at the controlled phase or amplitude, whereby the oscillator output constitutes the generated signal.

15. A method as claimed in claim 14 wherein the output of said first multiplier is fed via a second low-pass filter to a second multiplier which also receives said averaging-out increment, and the output of said second multiplier is fed via said first low-pass filter as a control voltage to said oscillator.

16. A method as claimed in claim 14, wherein the output of said first multiplier is divided into two channels, one of which selects and squares its zero-order Bessel Function output and the other selects and squares its first-order Bessel Function output, the first-order output being 90° phase-shifted and added to the zero-order output and their sum fed to a second multiplier which also receives twice said averaging-out increment, and the output of said second multiplier being fed via said first low-pass filter as a control voltage to said oscillator.

17. A method as claimed in claim 14 wherein instead of the first multiplier receiving its input from the aerial, it is received from a stable unmodulated local oscillator of substantially the carrier frequency.

18. A method as claimed in claim 2, wherein said generated signal is produced by feeding a signal received by or from a single omnidirectional reference aerial element to a single-sideband generator having as a second input said increment for averaging-out phase-differences, said generator being such as to produce an output which is either the sum or difference only of said two input signals, said second input deriving from oscillator means which receives as a control signal the scanning frequency at the controlled phase or amplitude, whereby the single-sideband generator output constitutes said generated signal.

19. A method as claimed in claim 18 wherein said oscillator means conprises either a single oscillator, or two oscillators differing in frequency by said averaging-out increment, one of said oscillators receiving said control signal and their two outputs being combined to produce said second input to said generator.

20. A method as claimed in claim 1 wherein said generated signal is multiplied directly by said received signal and is also multiplied separately by said received signal after a 90° phase change of said generated signal, the two products being separately squared, their squares added, and the square-root of their sum derived as the Bessel Function representing the directional polar diagram.

21. Apparatus for processing signals received by one of a synthetic-aperture aerial from an external radiator, and by a synthetic-aperture aerial at an external position, said signals including a carrier frequency which is phase-modulated at the scanning frequency of said aerial, comprising:
means for generating a signal of the same carrier frequency as the received signal and phase-modulated at the scanning frequency;
means for multiplying the generated signal by the received signal to derive an output which includes selectable Bessel Function representing a directional polar diagram;
and means for controlling one of phase and amplitude based upon the aerial configuration of the scanning frequency, as applied to produce said phase-modulation of the generated signal, in order to maximise or minimise, as appropriate, a selected Bessel Function and thereby control the bearing direction of said polar diagram relative to the aerial.

22. Apparatus as claimed in claim 21 comprising means for shifting the generated carrier by an increment in order to average-out phase differences between the received and generated carriers.

23. Apparatus as claimed in claim 21 comprising means for selecting the component of the multiplied output unmodulated by the scanning frequency, constituting a zero-order Bessel Function whose maximum value represents a polar diagram having its main lobe in the bearing direction.

24. Apparatus as claimed in claim 21 comprising means for selecting the component of the multiplied output modulated by the scanning frequency or a harmonic thereof, constituting a first-order or higher-order Bessel Function whose minimum value represents a polar diagram having a null in the bearing direction.

25. Apparatus as claimed in claim 23 comprising means for adding two fixed scanning-frequency phase-shifts or amplitude-shifts to said controlling phase of the scanning-frequency in opposite senses, means for applying the two summed phases to phase-modulate or amplitude-modulate the carriers of two generated signals, and means for separately multipling said two modulated carriers by the received signal to derive outputs constituting two zero-order Bessel Functions whose maximum values represent a polar diagram having two overlapping main lobes which are symmetrical about the bearing direction.

26. Apparatus as claimed in claim 24 comprising means for 90° phase-shifting the controlling phase of the scanning frequency or a harmonic thereof, and means for multiplying said selected first-order or higher-order component by said phase-shifted version of the controlling phase in order to derive an output having reduced noise.

27. Apparatus as claimed in claim 22, comprising means for deriving a zero-order Bessel Function amplitude-modulating, means for 90° phase-shifting said derived zero-order Bessel Function amplitude-modulating said averaging-out increment, means for deriving a first-order Bessel Function amplitude-modulating said averaging-out increment, and means for detecting said derived first-order Bessel Function amplitude-modulated averaging-out increment in effectively a synchronous manner with respect to said 90° phase-shifted version of said zero-order Bessel Function amplitude-modulated averaging-out increment, in order to obtain an output whose polarity defines on which side of the null the instantaneous direction of the received signal lies.

28. Apparatus as claimed in claim 27 comprising means for mormalising zero-order Bessel Function amplitude-modulating said averaging-out increment prior to said detection in order to obtain a relatively constant amplitude.

29. Apparatus of processing the signal transmitted from the synthetic-aperture aerial of a radio-beacon and received by an aircraft, comprising apparatus as claimed in claim 21 comprising means allowing the operator in the aircraft to adjust the phase or amplitude of the scanning frequency as applied to produce said phase-modulation of the generated signal in order to determine the bearing to the beacon as the phase, relative to a reference phase, required to obtain a Bessel Function output or outputs representing the bearing to the beacon.

30. Apparatus as claimed in claim 29 additionally comprising appartus arranged to process the signal from the synthetic-aperture aerial by means including an amplitude-limiter and, optionally, a frequency-discriminator.

31. Apparatus as claimed in claim 29 wherein the aerial comprises a circular array of omni-directional elements and means for scanning said elements, a single omni-directional reference element for continous transmission, and comprising means for controlling the phase of the scanning frequency.

32. Apparatus as claimed in claim 29 wherein the aerial comprises a linear array of omni-directional elements and means for sinusoidally scanning said elements, a single reference element for continuous transmission, and comprising means for controlling the amplitude of the scanning frequency.

33. Apparatus for determining the bearing of a signal or signals received by a synthetic aperture aerial from a radiator or radiators comprising apparatus as claimed in claim 21 and including means whereby the phase or amplitude of the scanning frequency as applied to produce said phase-modulation of the generated signal can be continuously varied at a low frequency to scan the polar diagram over an arc of interest, whereby the bearing of the received signal or signals is indicated by their temporal position relative to the phase or amplitude of said low-frequency scan.

34. Apparatus as claimed in claim 21 comprising a phase-lock loop for producing said generated signal, a connection for feeding the carrier-frequency signal received from the synthetic-aperture aerial to a first multiplier included in said loop, said loop further including a first low-pass filter and a voltage-controlled oscillator, said oscillator also being connected to receive as a control voltage the scanning frequency at the controlled phase or amplitude, whereby the oscillator output constitutes the generated signal.

35. Apparatus as claimed in claim 34 wherein the output of said first multiplier is connected via a second low-pass filter to a second multiplier which is also connected to receive said averaging-out increment, and the output of said second multiplier is connected via said first low-pass filter to serve as a control voltage to said oscillator.

36. Apparatus as claimed in claim 34, wherein the output of said first multiplier is divided into two channels, one of which comprises means for selecting and squaring its zero-order Bessel Function output and the other comprising means for selecting and squaring its first-order Bessel Function output, means for 90° phase-shifting the first-order output, adding it to the zero-order output, and feeding their sum to a second multiplier which is also connected to receive twice said averaging-out increment, and wherein the output of said second multiplier is connected via said first low-pass filter to serve as a control voltage to said oscillator.

37. Apparatus as claimed in claim 34 wherein instead of the first multiplier being connected to receive its input from the aerial, the apparatus comprises a stable unmodulated local oscillator of substantially the carrier frequency connected to the input of said multiplier.

38. Apparatus as claimed in claim 22, comprising a single-sideband generater connected to receive as one input a signal received by or from a single omnidirectional reference aerial element and to receive as a second input said increment for averaging-out phase-differences, said generator being arranged to produce an output which is either the sum or difference only of said two input signals, said second input deriving from oscillator means connected to receive as a control signal the scanning frequency at the controlled phase or amplitude, whereby the single-sideband generator output constitutes said generated signal.

39. Apparatus as claimed in claim 38 wherein said oscillator means conprises either a single oscillator, or two oscillators differing in frequency by said averaging-out increment, one of said oscillators being connected to receive said control signal, and means for combining their two outputs to produce said second input to said generator.

40. Apparatus as claimed in claim 21 comprising means for multiplying said generated signal directly by said received signal, means for 90° phase-shifting said generated signal and multiplying said phase-shifted generated signal by said received signal, means for separately squaring the outputs of said two multiplier means and adding their squares, and means for deriving the square-root of their sum as the Bessel Function representing the directional polar diagram.

* * * * *